(12) United States Patent
Fukami et al.

(10) Patent No.: US 7,848,137 B2
(45) Date of Patent: Dec. 7, 2010

(54) MRAM AND DATA READ/WRITE METHOD FOR MRAM

(75) Inventors: Shunsuke Fukami, Tokyo (JP); Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 261 days.

(21) Appl. No.: 12/294,397

(22) PCT Filed: Mar. 20, 2007

(86) PCT No.: PCT/JP2007/055650
§ 371 (c)(1),
(2), (4) Date: Sep. 24, 2008

(87) PCT Pub. No.: WO2007/119446

PCT Pub. Date: Oct. 25, 2007

(65) Prior Publication Data
US 2009/0251955 A1   Oct. 8, 2009

(30) Foreign Application Priority Data
Mar. 24, 2006   (JP) .............................. 2006-082188

(51) Int. Cl.
*G11C 11/00* (2006.01)
(52) U.S. Cl. ....................... 365/158; 365/171
(58) Field of Classification Search ................ 365/158, 365/171, 145, 117
See application file for complete search history.

(56) References Cited
U.S. PATENT DOCUMENTS
6,888,742 B1 * 5/2005 Nguyen et al. .............. 365/158

FOREIGN PATENT DOCUMENTS

| JP | 11-195824 | 7/1999 |
|---|---|---|
| JP | 2002-56665 | 2/2002 |
| JP | 2004-153070 | 5/2004 |
| JP | 2004-172614 | 6/2004 |
| JP | 2004-179183 | 6/2004 |
| JP | 2004-348934 | 12/2004 |

(Continued)

OTHER PUBLICATIONS

A Novel Nonvolatile Memory Wit h Spin Torque Transfer Magnetization Switchiing: SIN-RAM, M Hosomi et al, 34002766, 2005.

(Continued)

*Primary Examiner*—Vu A Le
(74) *Attorney, Agent, or Firm*—Young & Thompson

(57) ABSTRACT

An MRAM according to the present invention is provided with a magnetic recording layer being a ferromagnetic layer and a pinned layer connected to the magnetic recording layer through a nonmagnetic layer. The magnetic recording layer includes a magnetization switching region, a first magnetization fixed region and a second magnetization fixed region. The magnetization switching region has reversible magnetization and overlaps with the pinned layer. The first magnetization fixed region and the second magnetization fixed region are both connected to the same one end of the magnetization switching region. Also, the first magnetization fixed region and the second magnetization fixed region respectively have first fixed magnetization and second fixed magnetization whose directions are fixed. One of the first fixed magnetization and the second fixed magnetization is fixed in a direction toward the above-mentioned one end, and the other is fixed in a direction away from the above-mentioned one end.

24 Claims, 18 Drawing Sheets

FOREIGN PATENT DOCUMENTS

| | | |
|---|---|---|
| JP | 2005-505889 | 2/2005 |
| JP | 2005-93488 | 4/2005 |
| JP | 2005-109470 | 4/2005 |
| JP | 2005-150303 | 6/2005 |
| JP | 2005-191032 | 7/2005 |
| JP | 2005-223086 | 8/2005 |
| JP | 2005-277147 | 10/2005 |
| JP | 2005-294340 | 10/2005 |
| JP | 2006-073930 | 3/2006 |
| JP | 2006-270069 | 10/2006 |
| WO | 2006/090656 | 8/2006 |

OTHER PUBLICATIONS

Real-Space Observation of Current Driven Domain Wall Motion in Submieron Magnetic Wires, A. Yamaguchi et al., 077205-1, 2004 The American Physical Society, vol. 92, No. 7.

Research Trends in Spin Transfer Magnetization Switching, K. Yagami et al., vol. 28 No. 9, 2004.

* cited by examiner

Fig. 8

|  | BIT LINE | WORD LINE |
|---|---|---|
| WRITING | • BL1=H<br>• BL2=open | "1" WRITING<br>$\begin{cases} WL1=H \\ WL2=L \end{cases}$<br>"0" WRITING<br>$\begin{cases} WL1=L \\ WL2=H \end{cases}$ |
| READING | • BL1=open<br>• BL2=H | $\begin{cases} WL1=H \\ WL2=L \end{cases}$<br>OR<br>$\begin{cases} WL1=L \\ WL2=H \end{cases}$<br>OR<br>$\begin{cases} WL1=H \\ WL2=H \end{cases}$ |

US 7,848,137 B2

MRAM AND DATA READ/WRITE METHOD FOR MRAM

TECHNICAL FIELD

The present invention relates to an MRAM (Magnetic Random Access Memory). In particular, the present invention relates to an MRAM based on a spin transfer method and a data read/write method for the MRAM.

BACKGROUND ART

An MRAM is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, an MTJ (Magnetic Tunnel Junction) in which a tunnel barrier layer is sandwiched by two ferromagnetic layers is formed. The two ferromagnetic layers include a pinned layer whose magnetization direction is fixed and a free layer whose magnetization direction is reversible.

It is known that a resistance value (R+ΔR) of the MTJ when the magnetization directions of the pinned layer and the free layer are "anti-parallel" to each other becomes larger than a resistance value (R) when the magnetization directions are "parallel" to each other, due to the magnetoresistance effect. The MRAM uses the magnetoresistance element having the MTJ as a memory cell and nonvolatilely stores data by utilizing the change in the resistance value. Data writing to the memory cell is performed by switching the magnetization direction of the free layer.

Conventionally known methods of data writing to the MRAM include an "asteroid method" and a "toggle method". According to these write methods, a magnetic switching field necessary for switching the magnetization of the free layer increases in substantially inverse proportion to the size of the memory cell. That is to say, a write current tends to increase with the miniaturization of the memory cell.

As a write method capable of suppressing the increase in the write current with the miniaturization, there is proposed a "spin transfer method". For example, the spin transfer method is described in the following document: Yagami and Suzuki, Research Trends in Spin Transfer Magnetization Switching, Journal of The Magnetics Society of Japan, Vol. 28, No. 9, 2004. According to the spin transfer method, a spin-polarized current is injected to a ferromagnetic conductor, and direct interaction between spin of conduction electrons of the current and magnetic moment of the conductor causes the magnetization to be switched (hereinafter referred to as "spin transfer magnetization switching"). The spin transfer magnetization switching will be outlined below with reference to FIG. 1.

In FIG. 1, a magnetoresistance element is provided with a free layer 101, a pinned layer 103, and a tunnel barrier layer 102 that is a nonmagnetic layer sandwiched between the free layer 101 and the pinned layer 103. Here, the pinned layer 103, whose magnetization direction is fixed, is so formed as to be thicker than the free layer 101 and serves as a spin filter, i.e. a mechanism for generating the spin-polarized current. A state in which the magnetization directions of the free layer 101 and the pinned layer 103 are parallel to each other is related to data "0", while a state in which they are anti-parallel to each other is related to data "1".

The spin transfer magnetization switching shown in FIG. 1 is achieved by a CPP (Current Perpendicular to Plane) method, where a write current is injected in a direction perpendicular to the film plane. More specifically, the current is flowed from the pinned layer 103 to the free layer 101 in a transition from data "0" to data "1". In this case, electrons having the same spin state as that of the pinned layer 103 being the spin filter move from the free layer 101 to the pinned layer 103. As a result of the spin transfer (transfer of spin angular momentum) effect, the magnetization of the free layer 101 is switched. On the other hand, the current direction is reversed and the current is flowed from the free layer 101 to the pinned layer 103 in a transition from data "1" to data "0". In this case, electrons having the same spin state as that of the pinned layer 103 being the spin filter move from the pinned layer 103 to the free layer 101. As a result of the spin transfer effect, the magnetization of the free layer 101 is switched.

In this manner, the data writing is performed by transferring the spin electrons in the spin transfer magnetization switching. It is possible to set the magnetization direction of the free layer 101 depending on the direction of the spin-polarized current perpendicular to the film plane. Here, it is known that the threshold value of the writing (magnetization switching) depends on current density. Therefore, the write current necessary for the magnetization switching decreases with the reduction of the size of the memory cell. Since the write current is decreased with the miniaturization of the memory cell, the spin transfer magnetization switching is important in realizing a large-capacity MRAM.

As a related technique, Japanese Laid-Open Patent Application JP-2005-191032 discloses a magnetic storage device based on a domain wall motion method. The magnetic storage device is provided with a magnetization fixed layer whose magnetization is fixed, a tunnel insulating layer laminated on the magnetization fixed layer, and a magnetization free layer laminated on the tunnel insulating layer. The magnetization free layer has a connector section overlapping with the tunnel insulating layer and the magnetization fixed layer, constricted sections adjacent to both ends of the connector section, and a pair of magnetization fixed sections respectively formed adjacent to the constricted sections. The magnetization fixed sections are respectively provided with fixed magnetizations whose directions are opposite to each other. The magnetic storage device is further provided with a pair of magnetic information writing terminals which are electrically connected to the pair of magnetization fixed sections. By using the pair of magnetic information writing terminals, a write current penetrating through the connector section, the pair of constricted sections and the pair of magnetization fixed sections of the magnetization free layer is flowed. A direction of the write current is controlled depending on a write data, and can be either a first direction or a second direction opposite to the first direction. A domain wall moves between the pair of constricted sections depending on the direction of the write current.

DISCLOSURE OF INVENTION

An object of the present invention is to provide a new MRAM using the spin transfer method.

Another object of the present invention is to provide a technique that can simplify a peripheral circuit for supplying a write current in an MRAM using the spin transfer method.

Still another object of the present invention is to provide an MRAM and a data writing method which can suppress deterioration of a tunnel barrier layer in an MTJ.

Still another object of the present invention is to provide an MRAM and a data writing method which can reduce a write current with reduction of a memory cell size.

In a first aspect of the present invention, an MRAM is provided. The MRAM is provided with a magnetic recording layer being a ferromagnetic layer and a pinned layer connected to the magnetic recording layer through a nonmagnetic layer. The magnetic recording layer includes a magnetization switching region, a first magnetization fixed region and a second magnetization fixed region. The magnetization switching region has reversible magnetization and overlaps with the pinned layer. The first magnetization fixed region and the second magnetization fixed region are both connected to the same one end of the magnetization switching region. Also, the first magnetization fixed region and the second magnetization fixed region respectively have first fixed magnetization and second fixed magnetization whose directions are fixed. One of the first fixed magnetization and the second fixed magnetization is fixed in a direction toward the above-mentioned one end, and the other is fixed in a direction away from the above-mentioned one end.

In the MRAM according to the present invention, the magnetization switching region, the first magnetization fixed region and the second magnetization fixed region form a "three-way intersection". Typically, the magnetic recording layer is formed in a Y-shape. In this case, a longitudinal direction of the magnetization switching region is a first direction, a longitudinal direction of the first magnetization fixed region is a second direction, and a longitudinal direction of the second magnetization fixed region is a third direction. Preferably, an angle between the first direction and the second direction is equal to an angle between the first direction and the third direction. The magnetic recording layer may be mirror symmetric with respect to an axis along the first direction.

The magnetic recording layer has a first side surface covering the magnetization switching region and the first magnetization fixed region, a second side surface covering the magnetization switching region and the second magnetization fixed region, and a third side surface covering the first magnetization fixed region and the second magnetization fixed region. At least one of the first side surface, the second side surface and the third side surface may be formed to be smooth.

It is desirable that the above-mentioned magnetization switching region, the first magnetization fixed region and the second magnetization fixed region are formed in the same plane.

The MRAM according to the present invention may be further provided with a pinning layer that includes at lease one of ferromagnet and antiferromagnet. The pinning layer fixes directions of the first fixed magnetization and the second fixed magnetization by any of exchange coupling and static coupling. The pinning layer is so provided as to overlap with at least the first magnetization fixed region and the second magnetization fixed region. A magnetization direction of the pinning layer is a direction from the first magnetization fixed region toward the second magnetization fixed region or a direction from the second magnetization fixed region toward the first magnetization fixed region. Alternatively, the pinning layer may include a first pinning layer configured to fix a direction of the first fixed magnetization, and a second pinning layer configured to fix a direction of the second fixed magnetization.

In the MRAM according to the present invention, the first magnetization fixed region and the second magnetization fixed region may be so formed as to have magnetocrystalline anisotropy along a direction in which the first magnetization fixed region and the second magnetization fixed region are arranged. In the MRAM according to the present invention, an external magnetic field may be applied in a direction from the first magnetization fixed region toward the second magnetization fixed region or in a direction from the second magnetization fixed region toward the first magnetization fixed region.

In the MRAM according to the present invention, the magnetic recording layer may comprise a plurality of ferromagnetic layers that are magnetically coupled with each other. At least one of the plurality of ferromagnetic layers includes the above-mentioned magnetization switching region, first magnetization fixed region and second magnetization fixed region.

The MRAM according to the present invention is provided with a plurality of magnetic memory cells arranged in an array. Each of the plurality of magnetic memory cells comprises the above-mentioned magnetic recording layer and pinned layer. The plurality of magnetic memory cells includes a first magnetic memory cell and a second magnetic memory cell that are arranged along a first axis. A shape of the magnetic recording layer of the first magnetic memory cell and a shape of the magnetic recording layer of the second magnetic memory cell may be line-symmetric with respect to the first axis.

In the MRAM according to the present invention, a first write current is flowed from the magnetization switching region to the first magnetization fixed region through the above-mentioned one end, at a time of a first write operation. On the other hand, at a time of a second write operation, a second write current is flowed from the magnetization switching region to the second magnetization fixed region through the above-mentioned one end.

For example, the first fixed magnetization is fixed in a direction toward the above-mentioned one end, and the second fixed magnetization is fixed in a direction away from the one end. In this case, magnetization of the magnetization switching region is directed to a direction away from the one end by the first write operation. On the other hand, magnetization of the magnetization switching region is directed to a direction toward the one end by the second write operation. The MRAM may be further provided with an assist interconnection that is formed to intersect with the magnetization switching region. In the first write operation, a direction of a magnetic field applied to the magnetization switching region by a current flowing through the assist interconnection is away from the one end. On the other hand, in the second write operation, a direction of a magnetic field applied to the magnetization switching region by a current flowing through the assist interconnection is toward the one end.

Alternatively, the first fixed magnetization is fixed in a direction away from the above-mentioned one end, and the second fixed magnetization is fixed in a direction toward the one end. In this case, magnetization of the magnetization switching region is directed to a direction toward the one end by the first write operation. On the other hand, magnetization of the magnetization switching region is directed to a direction away from the one end by the second write operation. The MRAM may be further provided with an assist interconnection that is formed to intersect with the magnetization switching region. In the first write operation, a direction of a magnetic field applied to the magnetization switching region by a current flowing through the assist interconnection is toward the one end. On the other hand, in the second write operation, a direction of a magnetic field applied to the magnetization switching region by a current flowing through the assist interconnection is away from the one end.

The assist interconnection may be provided in common for respective magnetization switching regions of the plurality of magnetic memory cells.

In the MRAM according to the present invention, a read current is flowed between the pinned layer and the magnetic recording layer through the nonmagnetic layer, at a time of a read operation.

In a second aspect of the present invention, a data read and write method for an MRAM is provided. The MRAM has a magnetic recording layer being a ferromagnetic layer and a pinned layer connected to the magnetic recording layer through a nonmagnetic layer. The magnetic recording layer includes a magnetization switching region having reversible magnetization and overlapping with the pinned layer, a first magnetization fixed region having first fixed magnetization, and a second magnetization fixed region having second fixed magnetization. The magnetization switching region, the first magnetization fixed region and the second magnetization fixed region form a three-way intersection. One of the first fixed magnetization and the second fixed magnetization is fixed in a direction toward the magnetization switching region, and the other is fixed in a direction away from the magnetization switching region.

The data write method according to the present invention includes: (A) a step of flowing a first write current from the magnetization switching region to the first magnetization fixed region, when writing a first data; and (B) a step of flowing a second write current from the magnetization switching region to the second magnetization fixed region, when writing a second data. Also, the data read method according to the present invention includes: (C) a step of flowing a read current between the pinned layer and the magnetic recording layer through the nonmagnetic layer, when reading the first data or the second data.

According to the present invention, a new MRAM using the spin transfer method is provided. According to the MRAM, the write current is flowed not in a direction penetrating through the MTJ but planarly in the magnetic recording layer. Due to the spin transfer effect by the spin electrons, the magnetization of the magnetization switching region in the magnetic recording layer is switched. According to the present invention, the write current is supplied to the magnetic recording layer from one direction. It is therefore possible to simplify the control of the write current and the configuration of the peripheral circuit. Moreover, since the write current does not penetrate through the MTJ at the time of data writing, deterioration of the tunnel barrier layer in the MTJ is suppressed. Furthermore, since the data writing is achieved by the spin transfer method, the write current is decreased with reduction of the memory cell size.

BRIEF DESCRIPTION OF DRAWINGS

FIG. 8 is a chart showing a summary of the data read/write method according to the first exemplary embodiment.

BEST MODE FOR CARRYING OUT THE INVENTION

An MRAM and a data read/write method according to the present invention will be described below with reference to the attached drawings. The MRAM is provided with a plurality of magnetic memory cells arranged in an array, and each magnetic memory cell has an MTJ.

1. First Exemplary Embodiment

1-1. Structure of Magnetic Memory Cell and Principle of Data Writing

Figure 1:
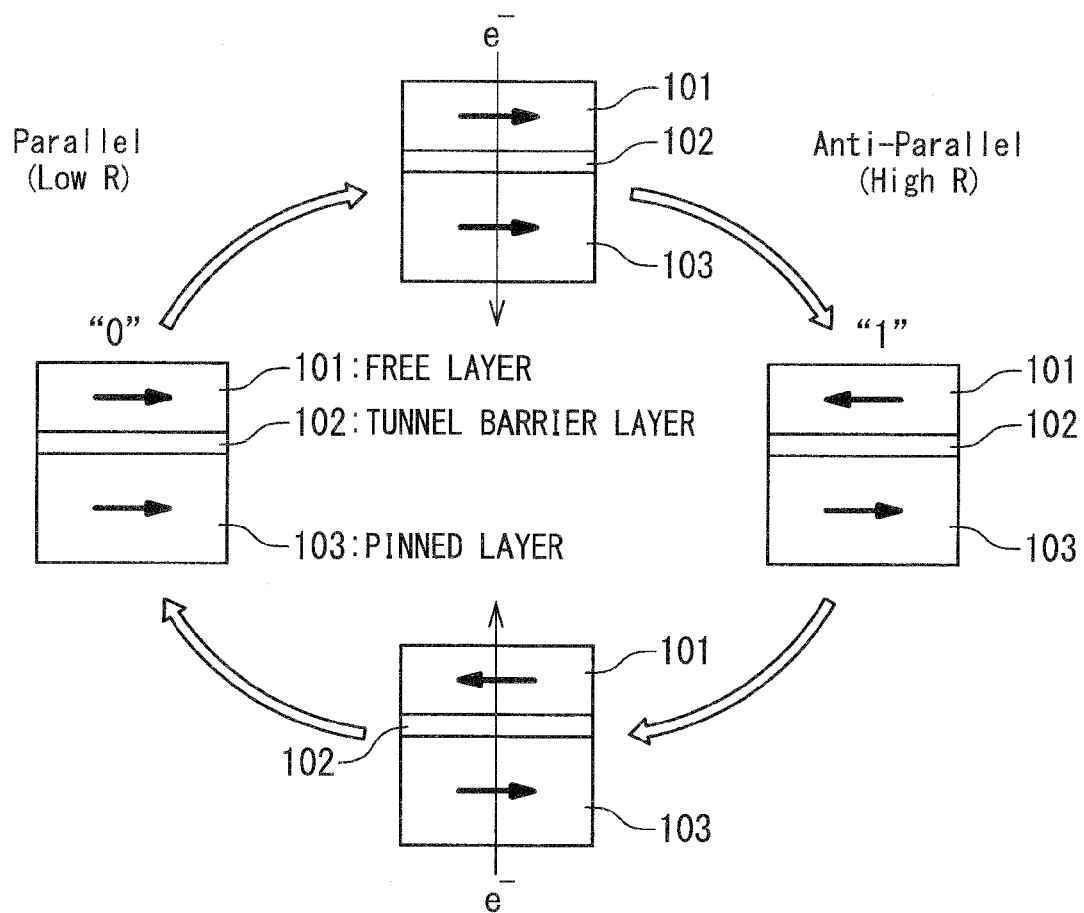
FIG. 1 is a diagram for explaining data writing according to a conventional spin transfer method.
Figure 2:
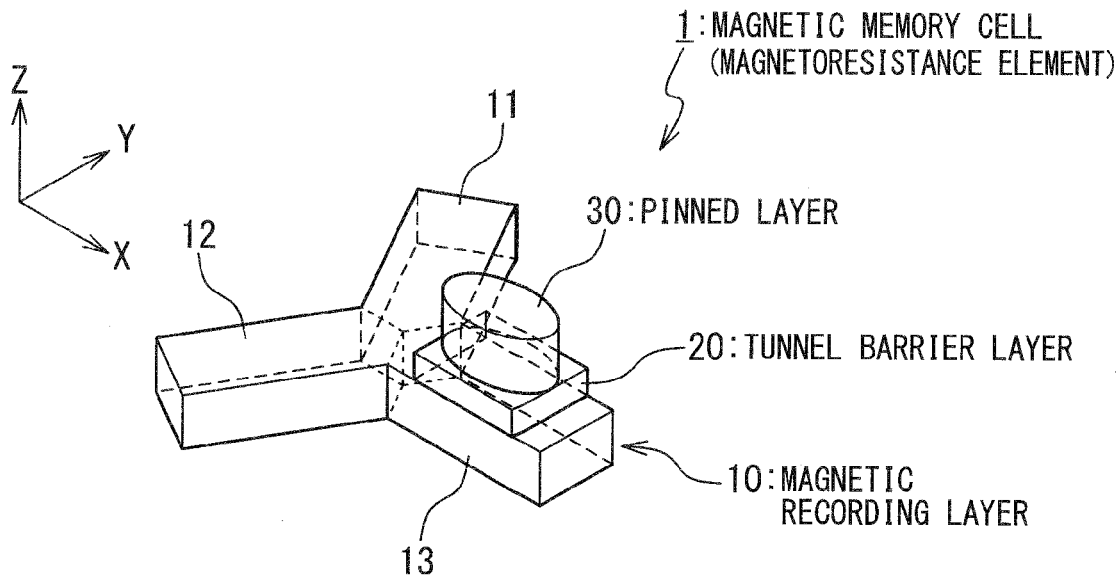
FIG. 2 is a perspective view showing a structure of a magnetic memory cell according to a first exemplary embodiment of the present invention.

FIG. 2 shows a structure of a magnetic memory cell 1 (magnetoresistance element) according to a first exemplary embodiment. The magnetic memory cell 1 is provided with a magnetic recording layer 10 and a pinned layer 30 that are ferromagnetic layers and a tunnel barrier layer 20 that is a nonmagnetic layer. The tunnel barrier layer 20 is sandwiched between the magnetic recording layer 10 and the pinned layer 30, and the magnetic recording layer 10, the tunnel barrier layer 20 and the pinned layer 30 form an MTJ (Magnetic Tunnel Junction). The magnetic recording layer 10 plays a role corresponding to a free layer.

The magnetic recording layer 10 is made of soft magnetic material and includes at least one element selected from the group consisting of Co, Fe and Ni. For example, the magnetic recording layer 10 is made of NiFe. The magnetic recording layer 10 may further include at least one element selected from the group consisting of Ag, Cu, Au, B, C, N, O, Mg, Al, Si, P, Ti, Cr, Zr, Nb, Mo, Hf, Ta, W, Pd and Pt. The tunnel barrier layer 20 is, for example, a thin insulating layer. The tunnel barrier layer 20 is exemplified by an insulating film such as an $Al_2O_3$ film, an $SiO_2$ film, a MgO film and an AlN film. Besides, nonmagnetic metal such as Cu, Zn, Au, Ag and Al can be used as the tunnel barrier layer 20. The pinned layer 30 includes a ferromagnetic layer whose magnetization is substantially fixed in one direction, and the ferromagnetic layer is provided adjacent to the tunnel barrier layer 20. Preferably, the pinned layer 30 is a laminated film in which ferromagnetic layers and a nonmagnetic layer are alternately laminated. It is also preferable that an antiferromagnetic layer is adjacent to at least one ferromagnetic layer of the laminated film, and the ferromagnetic layer and the antiferromagnetic layer are exchange coupled. For example, the pinned layer 30 is a laminate film made of CoFe/Ru/CoFe/PtMn.

As shown in FIG. 2, the magnetic recording layer 10 according to the present exemplary embodiment includes three different regions; a first magnetization fixed region 11, a second magnetization fixed region 12 and a magnetization switching region 13. Magnetizations of the first magnetization fixed region 11 and the second magnetization fixed region 12 are fixed in predetermined directions, respectively. On the other hand, magnetization of the magnetization switching region (magnetic free region) 13 is reversible. The magnetization switching region 13 having the reversible magnetization is so formed as to overlap with the pinned layer 30. In other words, the magnetization switching region 13 of the magnetic recording layer 10 is connected to the pinned layer 30 through the tunnel barrier layer 20. The first magnetization fixed region 11 and the second magnetization fixed region 12 are both connected to the same one end of the magnetization switching region 13. That is to say, the first magnetization fixed region 11, the second magnetization fixed region 12 and the magnetization switching region 13 form a "three-way intersection".

Figure 3:
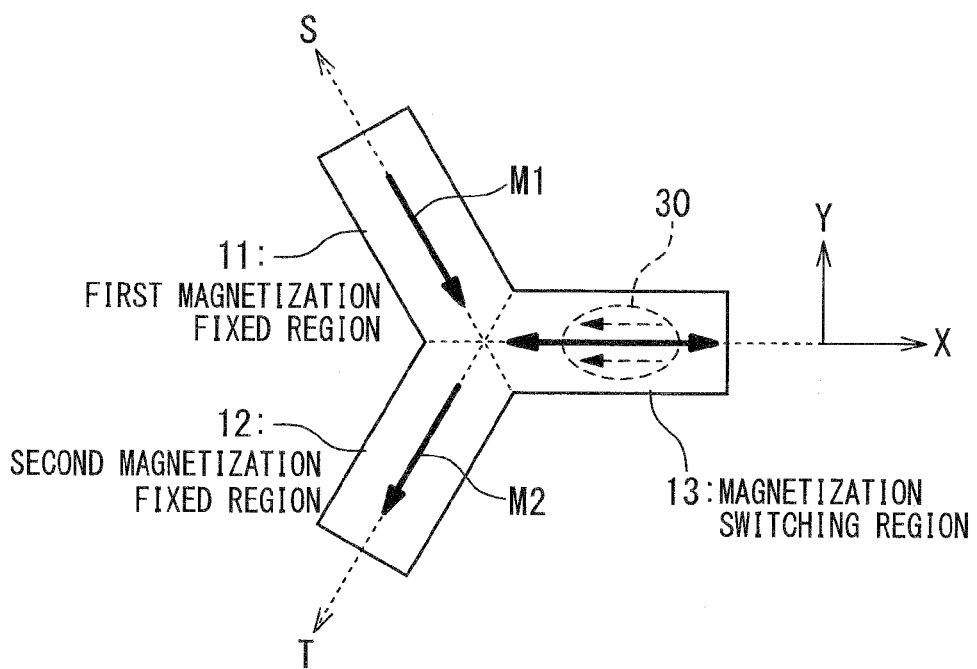
FIG. 3 is a plan view showing the structure of the magnetic memory cell shown in FIG. 2.

Preferably, the first magnetization fixed region 11, the second magnetization fixed region 12 and the magnetization switching region 13 are formed in the same plane (XY plane). One example of a shape of the magnetic recording layer 10 in the XY plane is shown in FIG. 3. In FIG. 3, the magnetization switching region 13 is formed along the X direction (X axis) and its longitudinal direction is the X direction. Also, the first magnetization fixed region 11 is formed along the S direction (S axis) and its longitudinal direction is the S direction. Also, the second magnetization fixed region 12 is formed along the T direction (T axis) and its longitudinal direction is the T direction. The S axis and the T axis are oblique to the X axis and the Y axis, and respective angles between the S and T axes and the X axis are larger than 90 degrees. That is to say, the magnetic recording layer 10 is formed in a "Y-shape" according to the present exemplary embodiment.

The magnetization direction in each region is also indicated by an arrow in FIG. 3. Moreover, projection of the pinned layer 30 and the magnetization direction thereof are also indicated by a dotted line and a dotted arrow, respectively. Let us consider a case where the magnetization direction of the pinned layer 30 is fixed in the −X direction. On the other hand, the magnetization direction of the magnetization switching region 13 overlapping with the pinned layer 30 is reversible and can be either the +X direction or the −X direction due to shape anisotropy. That is, the magnetization of the magnetization switching region 13 is allowed to be parallel or anti-parallel to the magnetization of the pinned layer 30.

The first magnetization fixed region 11 has first fixed magnetization M1 whose direction is fixed along the S axis. The second magnetization fixed region 12 has second fixed magnetization M2 whose direction is fixed along the T axis. More specifically, the direction of the first fixed magnetization M1 is fixed in a direction toward the magnetization switching region 13, namely, toward a boundary between the first magnetization fixed region 11 and the magnetization switching region 13. On the other hand, the direction of the second fixed magnetization M2 is fixed in a direction away from the magnetization switching region 13, namely, away from a boundary between the second magnetization fixed region 12 and the magnetization switching region 13. It can be said that the magnetization direction changes smoothly in a transition region from the first magnetization fixed region 11 to the second magnetization fixed region 12. It should be noted that the "magnetization fixation" will be described later (refer to Section 1-3).

Described below will be a principle of data writing with respect to the magnetic memory cell 1. According to the present exemplary embodiment, the data writing is achieved by the spin transfer method (Spin Transfer Data Writing).

First Structural Example

Figure 4:
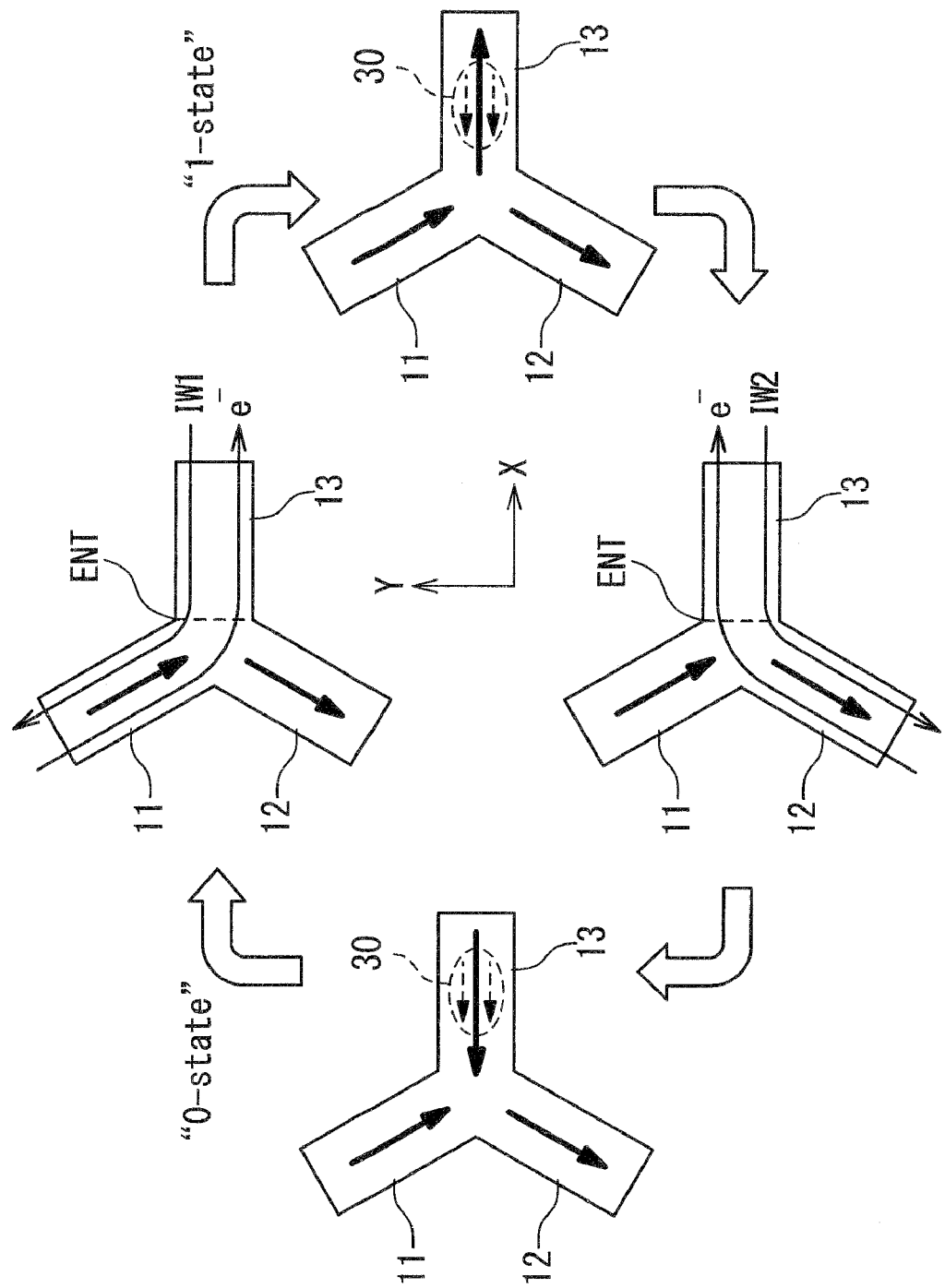
FIG. 4 is a plan view showing a principle of data writing for the magnetic memory cell shown in FIG. 3.

FIG. 4 shows a principle of data writing for the structure shown in FIG. 3. A state in which the magnetization directions of the magnetization switching region 13 and the pinned layer 30 are parallel to each other is related to data "0". On the other hand, a state in which the magnetization directions of the magnetization switching region 13 and the pinned layer 30 are anti-parallel to each other is related to data "1".

At a time of writing the data "1" (first writing), a first write current IW1 is flowed from the magnetization switching region 13 to the first magnetization fixed region 11. In this case, electrons (spin electrons) are injected from the first magnetization fixed region 11 into the magnetization switching region 13 through the boundary (entrance) ENT. The spin of the injected electrons affects a magnetic moment of the magnetization switching region 13. Since the magnetization direction of the first magnetization fixed region 11 is toward the magnetization switching region 13 (i.e. right-pointing), right-pointing spin torque is given to the magnetization switching region 13. As a result, the magnetization of the magnetization switching region 13 is reversed, and its magnetization direction is switched to a direction (+X direction) away from the boundary ENT (Spin Transfer Magnetization Switching).

On the other hand, at a time of writing the data "0" (second writing), a second write current IW2 is flowed from the magnetization switching region 13 to the second magnetization fixed region 12. In this case, electrons (spin electrons) are injected from the second magnetization fixed region 12 into the magnetization switching region 13 through the boundary (entrance) ENT. The spin of the injected electrons affects a magnetic moment of the magnetization switching region 13. Since the magnetization direction of the second magnetization fixed region 12 is away from the magnetization switching region 13 (i.e. left-pointing), left-pointing spin torque is given to the magnetization switching region 13. As a result, the magnetization of the magnetization switching region 13 is reversed, and its magnetization direction is switched to a direction (−X direction) toward the boundary ENT.

In this manner, the magnetization direction of the magnetization switching region 13 is switched by the write currents IW1 and IW2 which flow planarly in the magnetic recording layer 10. Since the write currents IW1 and IW2 do not penetrate through the MTJ, deterioration of the tunnel barrier layer 20 in the MTJ can be suppressed. Moreover, since the data writing is achieved by the spin transfer method, the write currents IW1 and IW2 can be decreased with the reduction of the memory cell size.

It can be said that the first magnetization fixed region 11 and the second magnetization fixed region 12 serve as supply sources of the electrons having different spins. According to the present exemplary embodiment, the electrons having different spins are injected into the magnetization switching region 13 through the same boundary (entrance) ENT. In other words, the write currents IW1 and IW2 are flowed in the same direction in the magnetization switching region 13. In this case, the write currents IW1 and IW2 just need to be supplied from one direction to the magnetization switching region 13 of the magnetic recording layer 10. It is therefore possible to simplify the control of the write currents and a configuration of a peripheral circuit.

Moreover, at the time of the first writing, the write current IW1 does not flow in the second magnetization fixed region 12 which does not contribute to the spin electron supply, but flows only in the magnetization switching region 13 and the first magnetization fixed region 11 which relate to the spin torque transfer. Also, at the time of the second writing, the write current IW2 does not flow in the first magnetization fixed region 11 which does not contribute to the spin electron supply, but flows only in the magnetization switching region 13 and the second magnetization fixed region 12 which relate to the spin torque transfer. Since the write current IW does not flow in the magnetization fixed region which is not the supply source of the spin electrons, the fixed magnetization of the magnetization fixed region remains unaffected. Thus, the fixed magnetization of the magnetization fixed region is prevented from being reversed due to spin transfer from the other region.

Figure 5A:
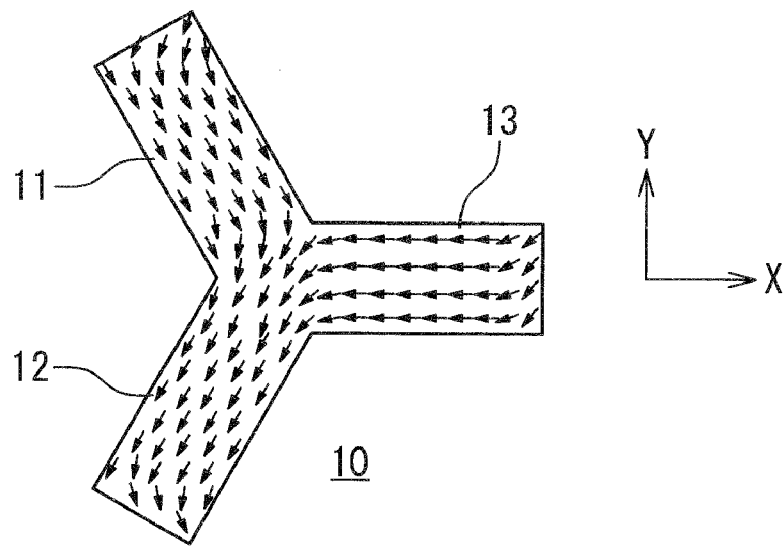
FIG. 5A is a diagram showing a magnetization distribution in a magnetic recording layer obtained from a simulation.
Figure 5B:
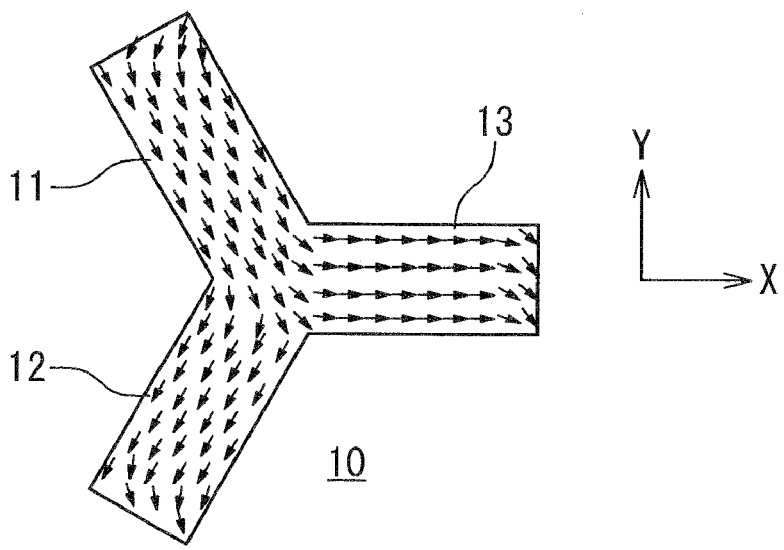
FIG. 5B is a diagram showing a magnetization distribution in a magnetic recording layer obtained from a simulation.

FIGS. 5A and 5B show magnetization distributions in the magnetic recording layer 10. FIG. 5A is associated with the data "0" while FIG. 5B is associated with the data "1". These magnetization distributions are obtained from a micromagnetic simulation. In FIG. 5A, the magnetization direction smoothly changes from the first magnetization fixed region 11 to the second magnetization fixed region 12 and from the magnetization switching region 13 to the second magnetization fixed region 12. A short domain wall is formed between the first magnetization fixed region 11 and the magnetization switching region 13. In FIG. 5B, on the other hand, the magnetization direction smoothly changes from the first magnetization fixed region 11 to the second magnetization fixed region 12 and from the first magnetization fixed region 11 to the magnetization switching region 13. A short domain wall is formed between the second magnetization fixed region 12 and the magnetization switching region 13.

Data reading is as follows. At the time of data reading, a read current is so supplied as to flow through the MTJ. For example, the read current is supplied to the pinned layer 30 and flows into the magnetic recording layer 10 through the tunnel barrier layer 20. Based on the read current or a read potential, a resistive value of the MTJ is detected and the magnetization direction of the magnetization switching region 13 is sensed. Alternatively, the read current may be flowed from the magnetic recording layer 10 to the pinned layer 30 through the tunnel barrier layer 20. It should be noted the former is preferable in order to match the direction of the read current with the directions of the write currents IW1 and IW2. In this case, it is possible to simplify the control of the write/read currents and the configuration of the peripheral circuit.

Second Structural Example

Figure 6:
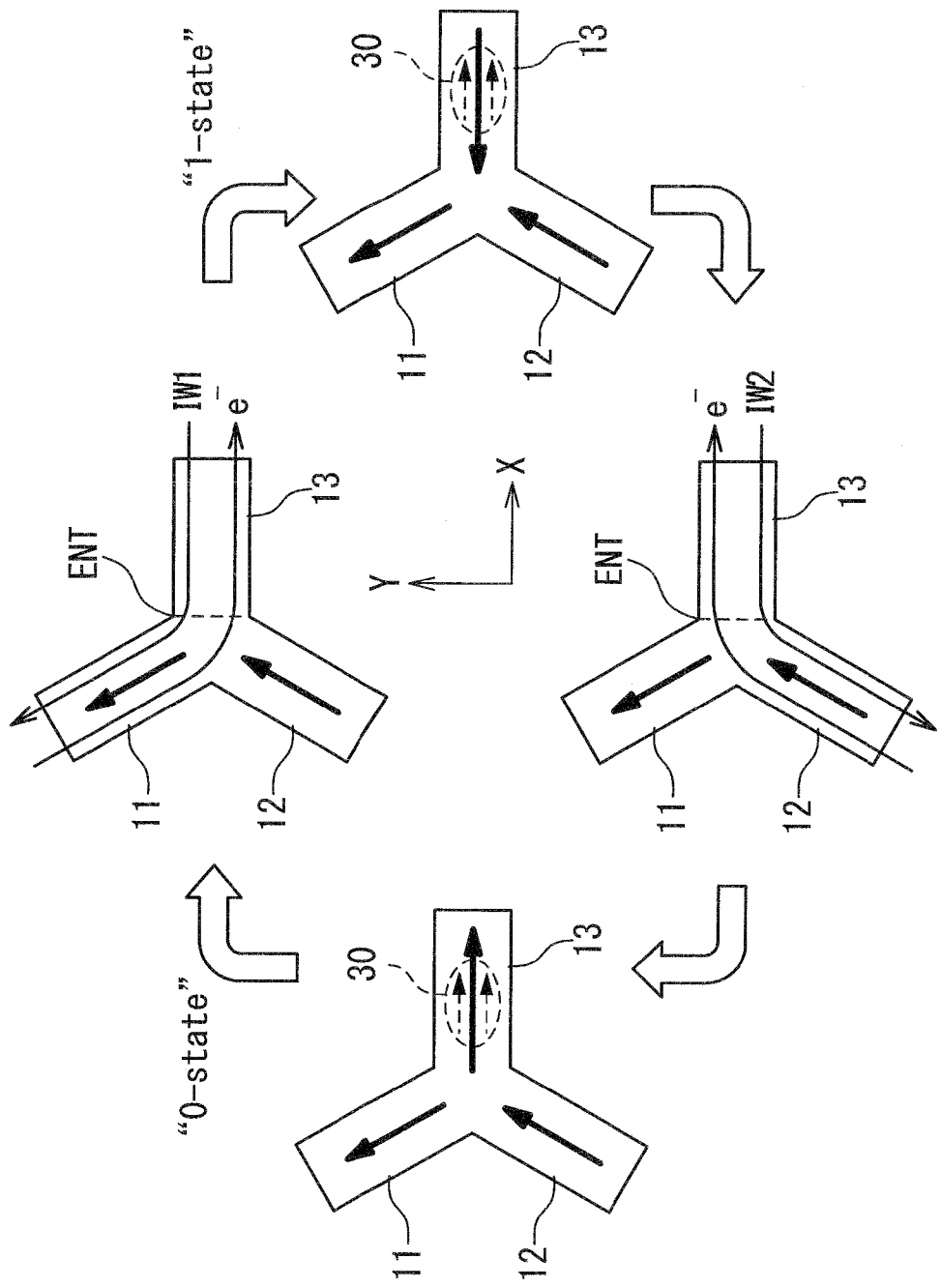
FIG. 6 is a plan view showing another structural example of the magnetic memory cell according to the first exemplary embodiment and a principle of data writing for the magnetic memory cell.

The magnetization direction of the first magnetization fixed region 11 and the magnetization direction of the second magnetization fixed region 12 are not limited to those shown in FIGS. 3 and 4. Another structure according to the present exemplary embodiment and a principle of data writing with respect to the structure are shown in FIG. 6. FIG. 6 is a diagram corresponding to FIG. 4, and an overlapping description will be omitted as appropriate.

The direction of the first fixed magnetization M1 of the first magnetization fixed region 11 is fixed in a direction away from the magnetization switching region 13, namely, away from the boundary ENT. On the other hand, the direction of the second fixed magnetization M2 of the second magnetization fixed region 12 is fixed in a direction toward the magnetization switching region 13, namely, toward the boundary ENT. Also, let us consider a case where the magnetization direction of the pinned layer 30 is fixed in the +X direction. The magnetization direction of the magnetization switching region 13 is the +X direction in the data "0" state, while the magnetization direction of the magnetization switching region 13 is the −X direction in the data "1" state.

At a time of writing the data "1" (first writing), a first write current IW1 is flowed from the magnetization switching region 13 to the first magnetization fixed region 11. In this case, electrons (spin electrons) are injected from the first magnetization fixed region 11 into the magnetization switching region 13 through the boundary (entrance) ENT. As a result, the magnetization of the magnetization switching region 13 is reversed, and its magnetization direction is switched to a direction (−X direction) toward the boundary ENT. On the other hand, at a time of writing the data "0" (second writing), a second write current IW2 is flowed from the magnetization switching region 13 to the second magnetization fixed region 12. In this case, electrons (spin electrons) are injected from the second magnetization fixed region 12 into the magnetization switching region 13 through the boundary (entrance) ENT. As a result, the magnetization of the magnetization switching region 13 is reversed, and its magnetization direction is switched to a direction (+X direction) away from the boundary ENT.

The same effects as in the foregoing first structural example can also be obtained by the structure shown in FIG. 6. The data reading is also the same as in the foregoing first structural example.

1-2. Circuit Configuration

Next, a circuit configuration for supplying the write currents IW1 and IW2 to the magnetic memory cell 1 according to the present exemplary embodiment will be explained below.

Figure 7:
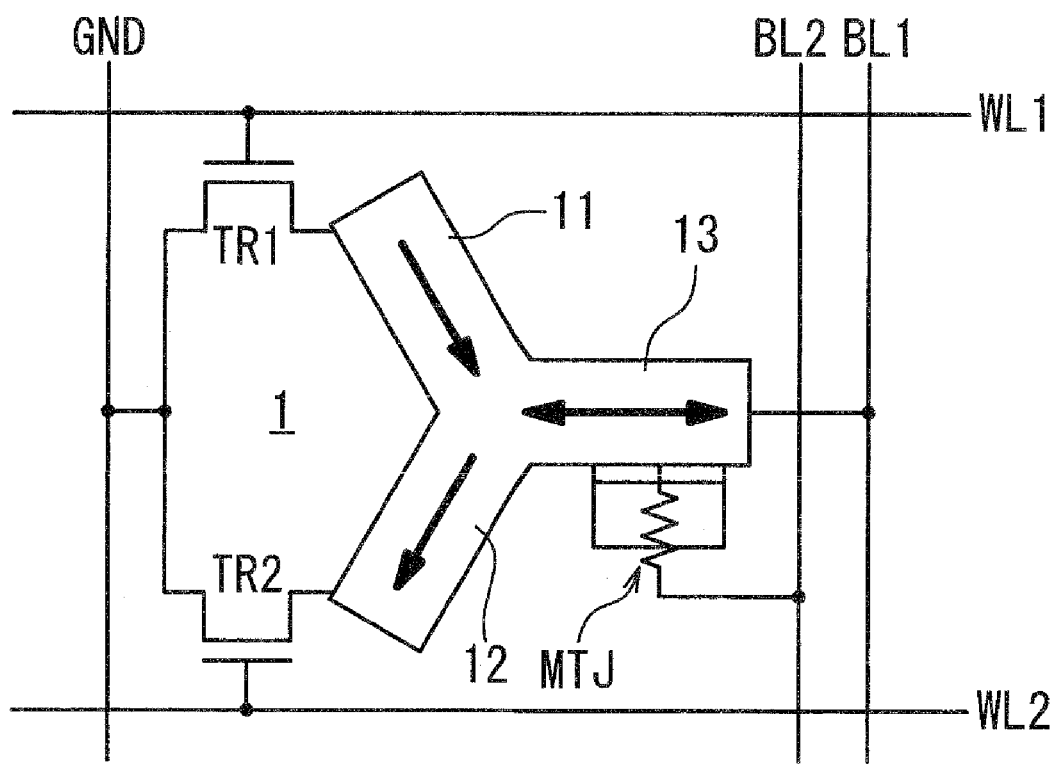
FIG. 7 is a circuit diagram showing an example of a circuit configuration of the magnetic memory cell according to the first exemplary embodiment.

FIG. 7 shows an example of a circuit configuration of the magnetic memory cell 1. In FIG. 7, two MOS transistors TR1 and TR2 are provided for one magnetic memory cell 1. One of source/drain of the first MOS transistor TR1 is connected to a ground line GND, and the other is connected to one end (the opposite side of the boundary ENT) of the first magnetization fixed region 11. Also, one of source/drain of the second MOS transistor TR2 is connected to the ground line GND, and the other is connected to one end (the opposite side of the boundary ENT) of the second magnetization fixed region 12. A gate of the first MOS transistor TR1 is connected to a first word line WL1, and a gate of the second MOS transistor TR2 is connected to a second word line WL2.

Moreover, a first bit line BL1 is connected to one end (the opposite side of the boundary ENT) of the magnetization switching region 13. The first bit line BL1 is a write interconnection used for supplying the write currents IW1 and IW2 to the magnetization switching region 13 (refer to FIG. 4 and FIG. 6). Also, a second bit line BL2 is connected to the pinned layer 30 that is one end of the MTJ. The second bit line BL2 is a read interconnection used for supplying the read current to the MTJ.

FIG. 8 shows a summary of the data read and write method in the case of the circuit configuration shown in FIG. 7. In the case of the data "1" writing, potentials of the first word line WL1 and the second word line WL2 are set to "High" and "Low", respectively. Therefore, the first MOS transistor TR1 is turned ON, and the second MOS transistor TR2 is turned OFF. Moreover, the first bit line BL1 (write interconnection) is selected and its potential is set to "High". On the other hand, the second bit line BL2 is set to "Open". As a result, the first write current IW1 flows from the first bit line BL1 through the magnetization switching region 13, the first magnetization fixed region 11 and the first MOS transistor TR1 to the ground line GND.

In the case of the data "0" writing, potentials of the first word line WL1 and the second word line WL2 are set to "Low" and "High", respectively. Therefore, the first MOS transistor TR1 is turned OFF, and the second MOS transistor TR2 is turned ON. Moreover, the first bit line BL1 (write interconnection) is selected and its potential is set to "High". On the other hand, the second bit line BL2 is set to "Open". As a result, the second write current IW2 flows from the first bit line BL1 through the magnetization switching region 13, the second magnetization fixed region 12 and the second MOS transistor TR2 to the ground line GND.

At the time of the data reading, potential of at least one of the first word line WL1 and the second word line WL2 is set to "High". Therefore, at least one of the first MOS transistor TR1 and the second MOS transistor TR2 is turned ON. Moreover, the second bit line BL2 (read interconnection) is selected and its potential is set to "High". On the other hand, the first bit line BL1 is set to "Open". As a result, the read current flows from the second bit line BL2 through the MTJ and the magnetic recording layer 10 to the ground line GND. It should be noted that the magnitude of the read current is set to be as small as the magnetization direction of the magnetization switching region 13 is not switched.

Figure 9:
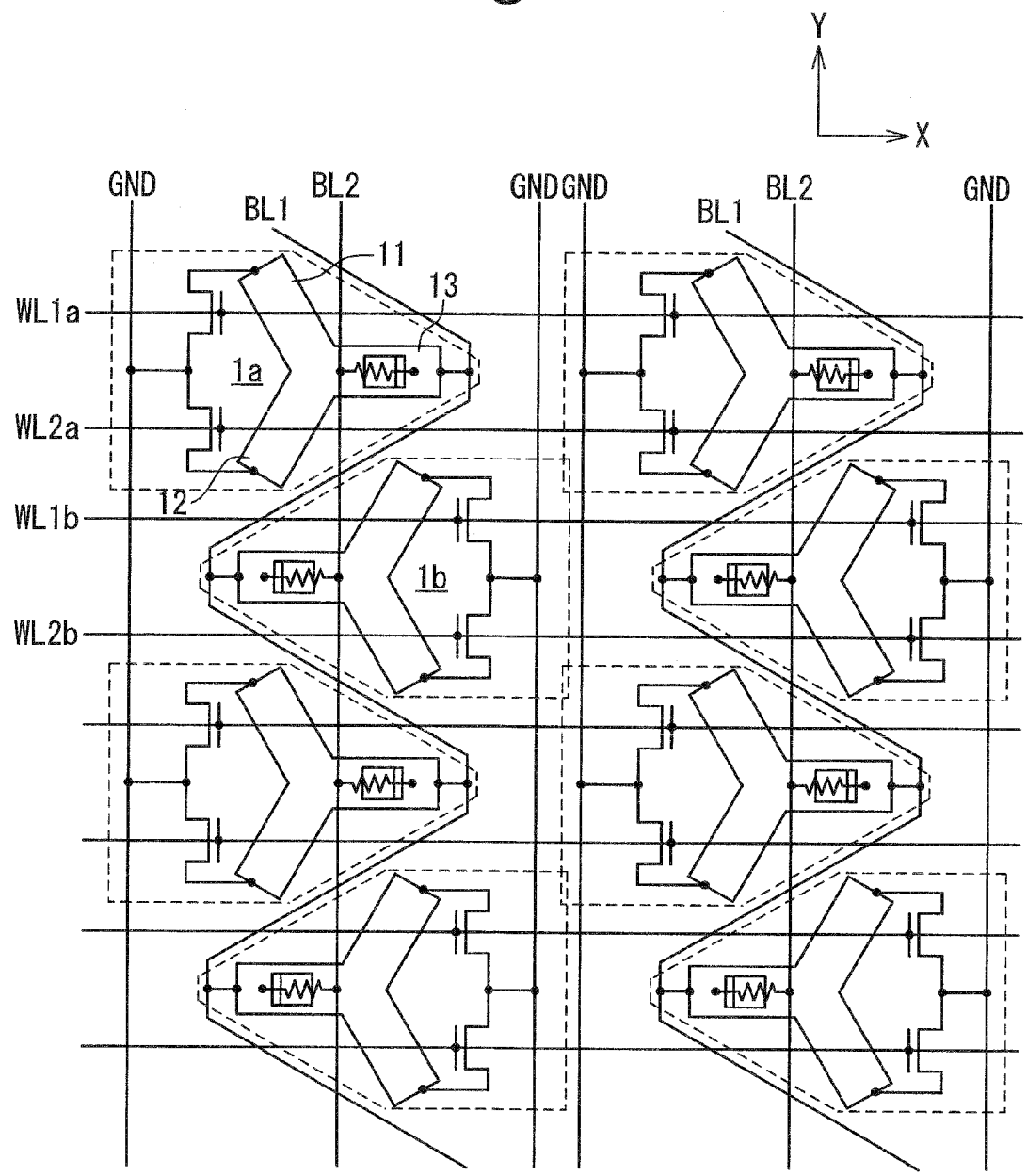
FIG. 9 is a plan view showing an example of a circuit configuration of a memory cell array according to the first exemplary embodiment.

FIG. 9 shows a memory cell array in which a plurality of magnetic memory cells 1 are arranged in an array. Each magnetic memory cell 1 has the same configuration as that shown in FIG. 7. For example, a magnetic memory cell 1a is connected to word lines WL1a and WL2a, bit lines BL1 and BL2 and a ground line. A magnetic memory cell 1b is connected to word lines WL1b and WL2b, the bit lines BL1 and BL2 and the ground line. The word line WL is shared by a group of magnetic memory cells arranged along the X axis. The bit line BL is shared by a group of magnetic memory cells arranged along the Y axis.

The magnetic memory cell 1a has a "first pattern" in which the magnetization switching region 13 projects on the right side (+X direction). On the other hand, the magnetic memory cell 1b has a "second pattern" in which the magnetization switching region 13 projects on the left side (−X direction). In other words, the magnetic memory cells 1a and 1b, which are arranged along the Y axis, are line-symmetric with respect to the Y axis. The memory cell array shown in FIG. 9 is designed such that the first pattern and the second pattern appear alternately. In this case, an area of the cell array can be reduced as compared with a case where only any one pattern appears, which is preferable.

Figure 10:
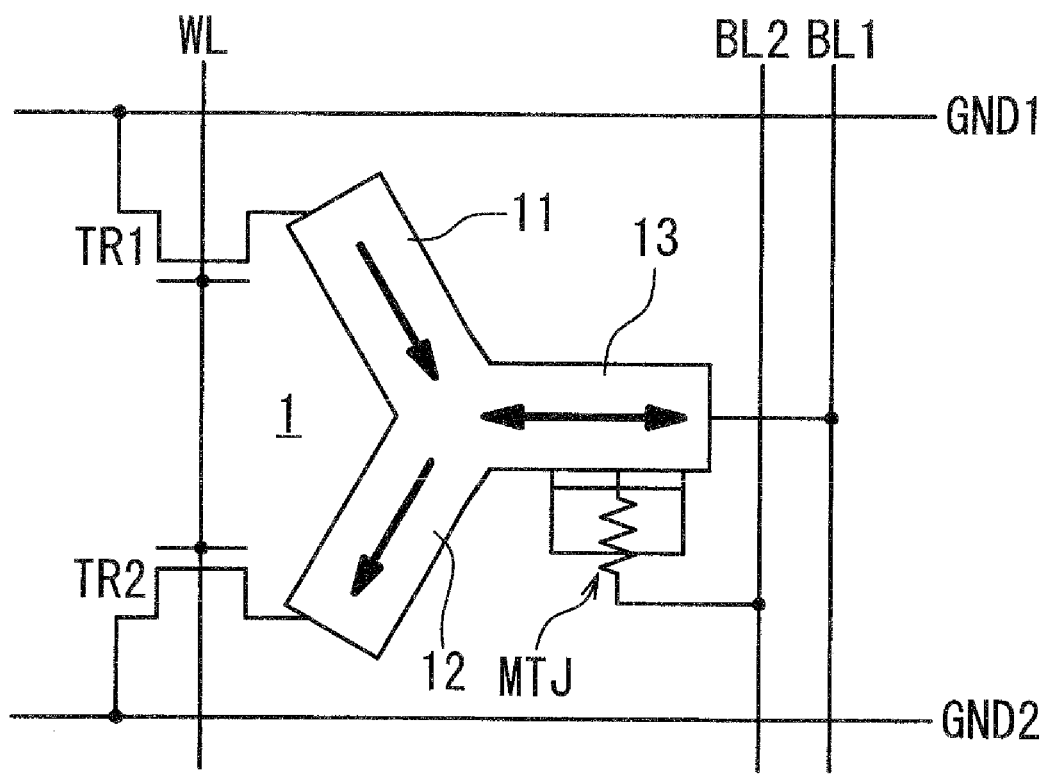
FIG. 10 is a circuit diagram showing another example of a circuit configuration of the magnetic memory cell according to the first exemplary embodiment.

FIG. 10 shows another example of a circuit configuration of the magnetic memory cell 1. In FIG. 10, one of source/drain of the first MOS transistor TR1 is connected to a first ground line GND1, and the other is connected to one end of the first magnetization fixed region 11. Also, one of source/drain of the second MOS transistor TR2 is connected to a second ground line GND2, and the other is connected to one end of the second magnetization fixed region 12. Gates of the MOS transistors TR1 and TR2 are connected to a common word line WL. Moreover, the first bit line BL1 (write interconnection) is connected to one end of the magnetization switching region 13. Also, the second bit line BL2 (read interconnection) is connected to the pinned layer 30 that is one end of the MTJ. This configuration also achieves the data reading and writing.

1-3. Magnetization Fixation

Next, methods for fixing the magnetizations of the first magnetization fixed region 11 and the second magnetization fixed region 12 will be described below. As an example, magnetization fixation in the case of the above-described first structural example will be explained below. In the case of the second structural example, the magnetization directions are fixed in the opposite directions.

(Exchange Coupling)

Figure 11:
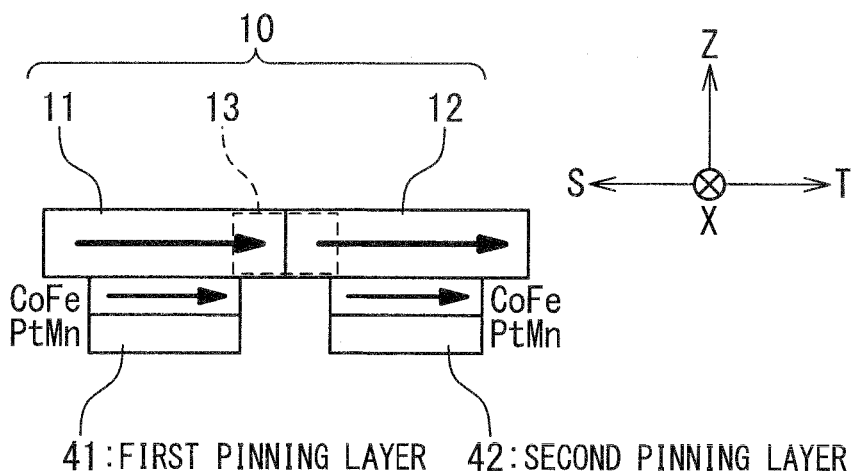
FIG. 11 is a side view showing an example of a method for fixing magnetization directions of magnetization fixed regions.

FIG. 11 is a side view showing the magnetic memory cell 1 provided with a magnetization fixation means. The magnetic memory cell 1 has a first pinning layer 41 and a second pinning layer 42 as the magnetization fixation means. The first pinning layer 41 applies a bias magnetic field in the −S direction to the first magnetization fixed region 11. On the other hand, the second pinning layer 42 applies a bias magnetic field in the +T direction to the second magnetization fixed region 12.

For example, the first pinning layer 41 includes a ferromagnetic layer whose magnetization is fixed in the −S direction, and the ferromagnetic layer is formed to be in contact with the first magnetization fixed region 11. The first pinning layer 41 fixes the direction of the fixed magnetization M1 of the first magnetization fixed region 11 in the −S direction by the "exchange coupling". On the other hand, the second pinning layer 42 includes a ferromagnetic layer whose magnetization is fixed in the +T direction, and the ferromagnetic layer is formed to be in contact with the second magnetization fixed region 12. The second pinning layer 42 fixes the direction of the fixed magnetization M2 of the second magnetization fixed region 12 in the +T direction by the exchange coupling. The pinning layers 41 and 42 are, for example, laminated films of CoFe/PtMn utilizing exchange bias.

It should be noted that the configuration of the pinning layers 41 and 42 is not limited to that shown in FIG. 11. The pinning layers 41 and 42 may include only a ferromagnetic layer (CoFe and the like) or may include only an antiferromagnetic layer (PtMn and the like). The pinning layers 41 and 42 may include both of the ferromagnetic layer and the antiferromagnetic layer. The pinning layers 41 and 42 may further include an intermediate layer (Ru and the like) that is provided between the ferromagnetic layer and the magnetization fixed regions 11 and 12. The ferromagnetic layer and the magnetization fixed regions 11 and 12 may be ferromagnetically coupled with each other or may be antiferromagnetically coupled with each other. The ferromagnetic layer may be a multi-layer film magnetically coupled with each other through an intermediate layer (Ru and the like).

(Static Coupling)

Figure 12:
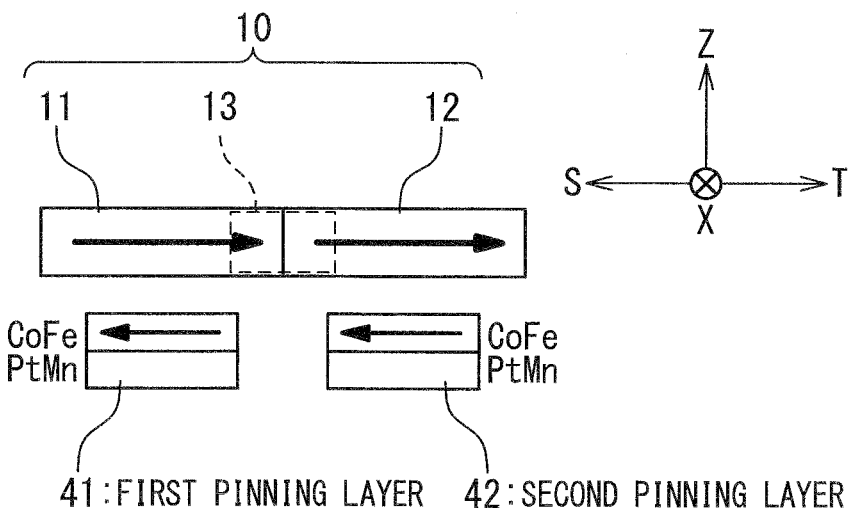
FIG. 12 is a side view showing another example of the method for fixing magnetization directions of magnetization fixed regions.

FIG. 12 is a side view showing the magnetic memory cell 1 provided with a magnetization fixation means. The magnetic memory cell 1 has a first pinning layer 41 and a second pinning layer 42 as the magnetization fixation means. The first pinning layer 41 applies a bias magnetic field in the −S direction to the first magnetization fixed region 11. On the other hand, the second pinning layer 42 applies a bias magnetic field in the +T direction to the second magnetization fixed region 12.

For example, the first pinning layer 41 includes a ferromagnetic layer whose magnetization is fixed in the +S direction, and the ferromagnetic layer is formed to be apart from the first magnetization fixed region 11. The first pinning layer 41 fixes the direction of the fixed magnetization M1 of the first magnetization fixed region 11 in the −S direction by the "static coupling". On the other hand, the second pinning layer 42 includes a ferromagnetic layer whose magnetization is fixed in the −T direction, and the ferromagnetic layer is formed to be apart from the second magnetization fixed region 12. The second pinning layer 42 fixes the direction of the fixed magnetization M2 of the second magnetization fixed region 12 in the +T direction by the static coupling. The pinning layers 41 and 42 are, for example, laminated films of CoFe/PtMn utilizing exchange bias.

It should be noted that the configuration of the pinning layers 41 and 42 is not limited to that shown in FIG. 12. The pinning layers 41 and 42 may include only a ferromagnetic layer (CoFe and the like). The pinning layers 41 and 42 may include both of the ferromagnetic layer and the antiferromagnetic layer. The ferromagnetic layer may be a multi-layer film magnetically coupled with each other through an intermediate layer (Ru and the like).

In FIGS. 11 and 12, the first pinning layer 41 and the second pinning layer 42 are provided below the first magnetization fixed region 11 and the second magnetization fixed region 12, respectively. The first pinning layer 41 and the second pinning layer 42 may be provided below or lateral to the first magnetization fixed region 11 and the second magnetization fixed region 12, respectively.

Figure 13A:
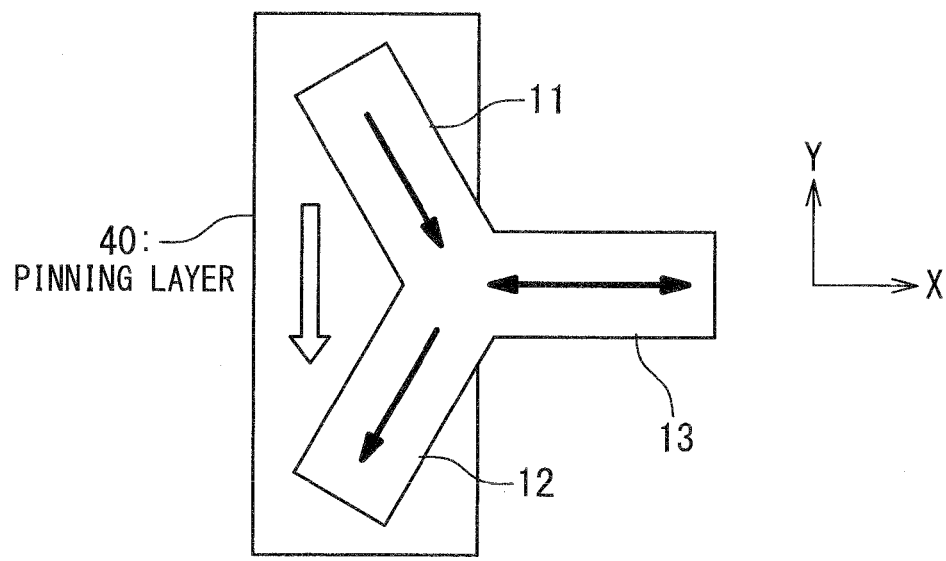
FIG. 13A is a plan view showing still another example of the method for fixing magnetization directions of magnetization fixed regions.
Figure 13B:
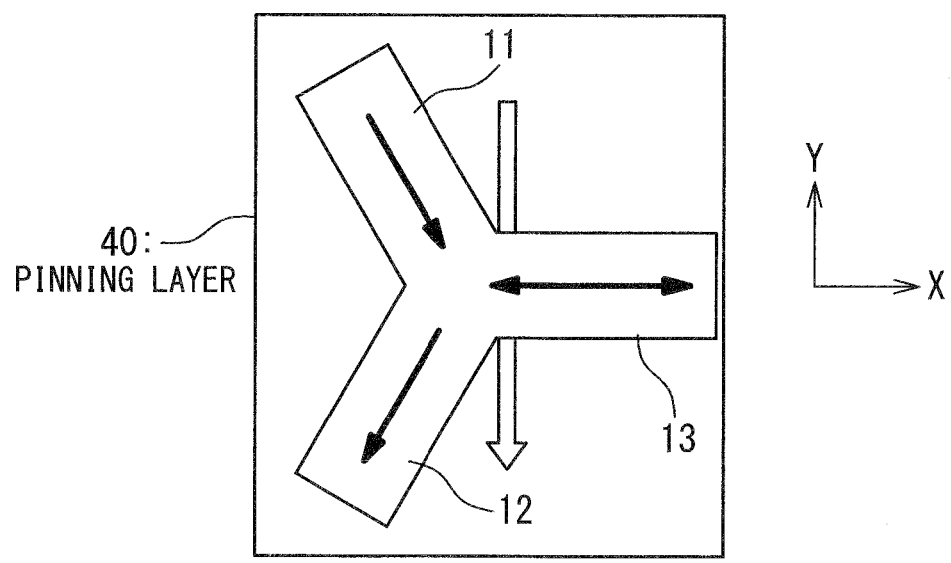
FIG. 13B is a plan view showing still another example of the method for fixing magnetization directions of magnetization fixed regions.

Alternatively, as shown in FIGS. 13A and 13B, one pinning layer 40 may be provided instead of the first pinning layer 41 and the second pinning layer 42. The pinning layer 40 is so provided as to overlap with at least the first magnetization fixed region 11 and the second magnetization fixed region 12. A magnetization direction of the pinning layer 40 is fixed in the −Y direction (direction from the first magnetization fixed region 11 toward the second magnetization fixed region 12). The magnetization of the pinning layer 40 affects the magnetization fixed regions 11 and 12 through the exchange coupling or the static coupling. Then, the magnetizations of the magnetization fixed regions 11 and 12 are stabilized along respective longitudinal directions due to shape anisotropy. Consequently, the magnetization directions of the magnetization fixed regions 11 and 12 are fixed as shown in the figures.

To put it the other way around, the magnetization fixation method shown in FIGS. 13A and 13B is possible because of the structure according to the present exemplary embodiment. In the present exemplary embodiment, it is necessary to design such that the magnetizations of the magnetization fixed regions 11 and 12 both have −Y direction component. In other words, the magnetization directions of the magnetization fixed regions 11 and 12 are not opposite to but equal to each other with regard to the Y component. Therefore, it is not necessary to separately fix the magnetizations of the magnetization fixed regions 11 and 12. It is possible by using the above-mentioned one pinning layer 40 to fix the magnetization directions of the magnetization fixed regions 11 and 12.

(Others)

Figure 14:
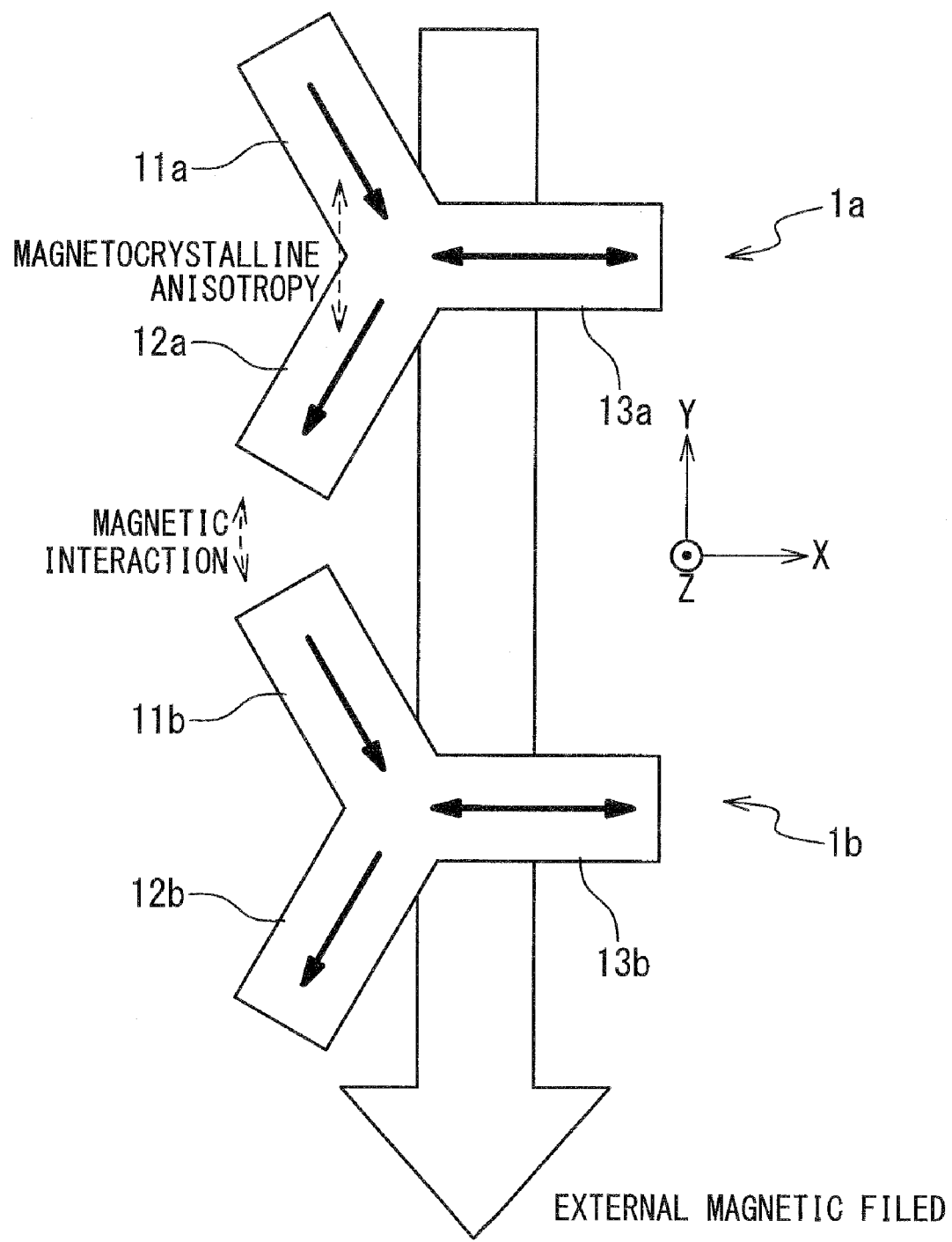
FIG. 14 is a plan view showing still other examples of the method for fixing magnetization directions of magnetization fixed regions.

FIG. 14 summarizes other magnetization fixation methods. For example, the magnetization fixed regions 11 and 12 are so formed as to have magnetocrystalline anisotropy along the Y axis direction (the direction in which the first magnetization fixed region 11 and the second magnetization fixed region 12 are arranged). More specifically, the magnetization fixed regions 11 and 12 are formed by performing sputtering and annealing under a magnetic field along the Y axis direction. The magnetizations of the magnetization fixed regions 11 and 12 are stabilized along respective longitudinal directions due to the magnetocrystalline anisotropy and shape anisotropy. As another method, an external magnetic field in the Y direction may be uniformly applied to the magnetic memory cell 1. For example, a magnet of a few Oe is provided for a package.

Also, adjacent magnetic memory cells 1a and 1b may be magnetically interacted with each other as shown in FIG. 14. In the case of the example shown in FIG. 14, the fixed magnetization of the second magnetization fixed region 12a of the magnetic memory cell 1a and the fixed magnetization of the first magnetization fixed region 11b of the adjacent magnetic memory cell 1b mutually affect each other. As a result, the magnetization fixation becomes more stable and thermal disturbance resistance is improved. In order to make the influence greater, a distance between the adjacent magnetic memory cells 1a and 1b just needs to be designed smaller. The above-described various magnetization fixation methods can be applied in combination. In that case, the magnetization fixation is further stabilized and the thermal disturbance resistance is further improved.

1-4. Effects

According to the present invention, as described above, a new data read and write method is proposed with regard to the random-accessible MRAM. The data writing is achieved by the one direction spin transfer within the magnetic recording layer 10. The data reading is achieved by using the MTJ. Resultant effects are as follows.

First, excellent selectivity of the memory cell can be ensured as compared with the asteroid method. In the case of the asteroid method, variation in a threshold value of a write magnetic field deteriorates the memory cell selectivity in a 2-dimensional memory cell array. According to the spin transfer method, however, the write current acts only on a target memory cell. Thus, the disturbance is greatly reduced. In other words, a selective writing property is improved.

Also, a scaling property of the write current is improved as compared with the asteroid method and the toggle method. In the case of the asteroid method and the toggle method, a magnetic switching field necessary for switching the magnetization of the magnetic switching region increases in substantially inverse proportion to the memory cell size. That is to say, the write current tends to increase with the miniaturization of the memory cell. According to the spin transfer method, however, the threshold value of the magnetization switching depends on current density. Since the current density is increased with the reduction of the memory cell size, it is possible to reduce the write current with the miniaturization of the memory cell. In other words, it is not necessary to increase the write current when the memory cell size is reduced. In that sense, the scaling property of the write current is improved. This is important in realizing a large-capacity MRAM.

Also, a current-magnetic field conversion efficiency is increased as compared with the asteroid method and the toggle method. In the case of the asteroid method and the toggle method, the write current is consumed by Joule heating. It has been necessary to provide a write-dedicated wiring such as a flux keeper and a yoke structure in order to enhance the current-magnetic field conversion efficiency. This causes complexity of the manufacturing process and an increase in wiring inductance. According to the spin transfer method, however, the write current directly contributes to the spin transfer. Therefore, the current-magnetic field conversion efficiency is increased. Consequently, the complexity of the manufacturing process and the increase in the wiring inductance can be prevented.

Moreover, the deterioration of the MTJ (tunnel barrier layer 20) is suppressed as compared with the conventional spin transfer method. The conventional spin transfer magnetization switching is achieved by the CPP (Current Perpendicular to Plane) method, where the write current is injected in a direction perpendicular to the film plane. The write current at the time of data writing is much larger than the read current, and there is a possibility that the large current destroys the tunnel barrier layer 20. According to the write method in the present invention, however, a current path at the time of reading and a current path at the time of writing are separated from each other. More specifically, the write currents IW1 and IW2 do not penetrate through the MTJ but flow within the plane of the magnetic recording layer 10 at the time of the data writing. It is not necessary at the time of the data writing to inject a large current in a direction perpendicular to the MTJ film plane. Consequently, the deterioration of the tunnel barrier layer 20 in the MTJ can be suppressed.

Furthermore, to control the write currents becomes easier as compared with the conventional spin transfer method. According to the conventional, spin transfer method, especially the "domain wall motion method", it is necessary to reverse the write current direction depending on the write data. This complicates the control of the write currents and a configuration of a peripheral circuit. According to the present invention, however, the electrons having different spins are injected into the magnetization switching region 13 through the same boundary ENT, and the write currents IW1 and IW2 are flowed in the same direction (refer to FIGS. 4 and 6). The write currents IW1 and IW2 are supplied from one direction to the magnetization switching region 13 of the magnetic recording layer 10. Therefore, the control of the write currents and the configuration of the peripheral circuit are simplified.

Moreover, the magnetizations of the magnetization fixed regions are more stabilized as compared with the domain wall motion method. According to the conventional domain wall motion method, the write current is flowed also in a magnetization fixed region that is not the supply source of the spin electrons. According to the present invention, on the other hand, the write current does not flow in the magnetization fixed region that is not the supply source of the spin electrons. Therefore, the fixed magnetization of the magnetization fixed region is prevented from being reversed due to spin transfer from the other region.

According to the present invention, the above-described effects can be simultaneously obtained. The technique according to the present invention is extremely useful in order to realize a high-integration, high-speed operation and low power consumption MRAM.

2. Second Exemplary Embodiment

Figure 15:
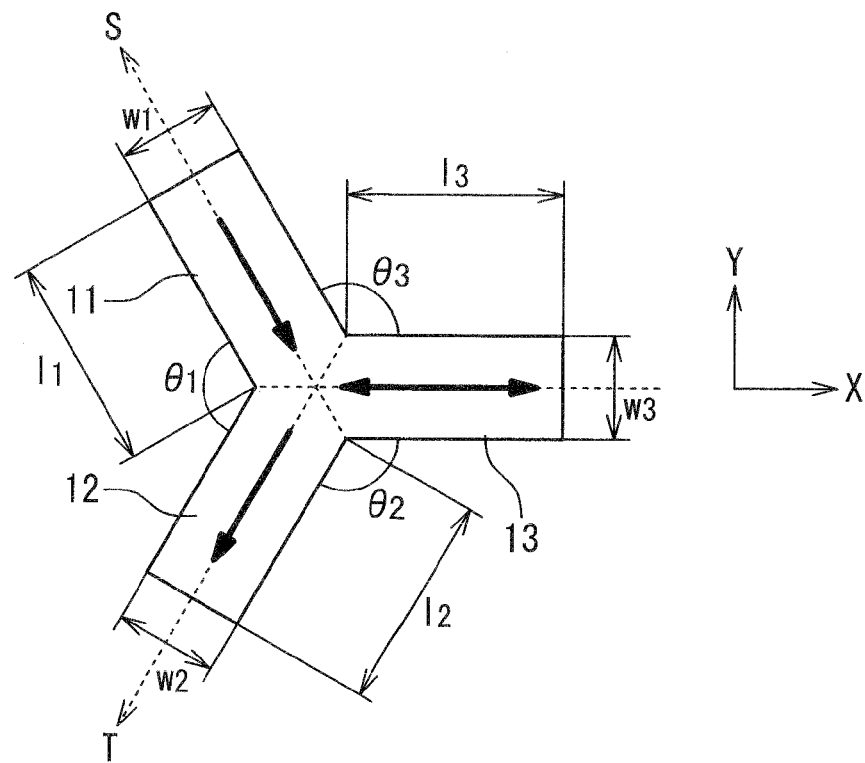
FIG. 15 is a plan view showing another structural example of the magnetic memory cell according to the present invention.

Other patterns are also possible as the shape of the magnetic recording layer 10. FIG. 15 shows parameters that define the shape of the magnetic recording layer 10. A length and a width of the first magnetization fixed region 11 are expressed by $l_1$ and $w_1$, respectively. A length and a width of the second magnetization fixed region 12 are expressed by $l_2$ and $w_2$, respectively. A length and a width of the magnetization switching region 13 are expressed by $l_3$ and $w_3$, respectively. An angle between the first magnetization fixed region 11 and the second magnetization fixed region 12, namely, an angle between the S axis and the T axis is expressed by $\theta_1$. An angle between the second magnetization fixed region 12 and the magnetization switching region 13, namely, an angle between the T axis and the X axis is expressed by $\theta_2$. An angle between the magnetization switching region 13 and the first magnetization fixed region 11, namely, an angle between the X axis and the S axis is expressed by $\theta_3$.

The parameters l and w can be respectively set to arbitrary values. Also, the parameters $\theta_2$ and $\theta_3$ can be respectively set to arbitrary values within a range from 90 degree to 180 degree. It should be noted that the parameters $\theta_2$ and $\theta_3$ are preferably set to the same value. In this case, a difference in injection efficiency of the spin electrons between the first write operation and the second write operation can be suppressed. Moreover, it is preferable that the width $w_1$ and the width $w_2$ are set to the same value and the length $l_1$ and the length $l_2$ are set to the same value. In other words, it is preferable that the magnetic recording layer 10 have a shape that is mirror symmetric with respect to the X axis. In this case, the first write current IW1 and the second write current IW2 are expected to correspond to each other in the magnitude.

Figure 16:
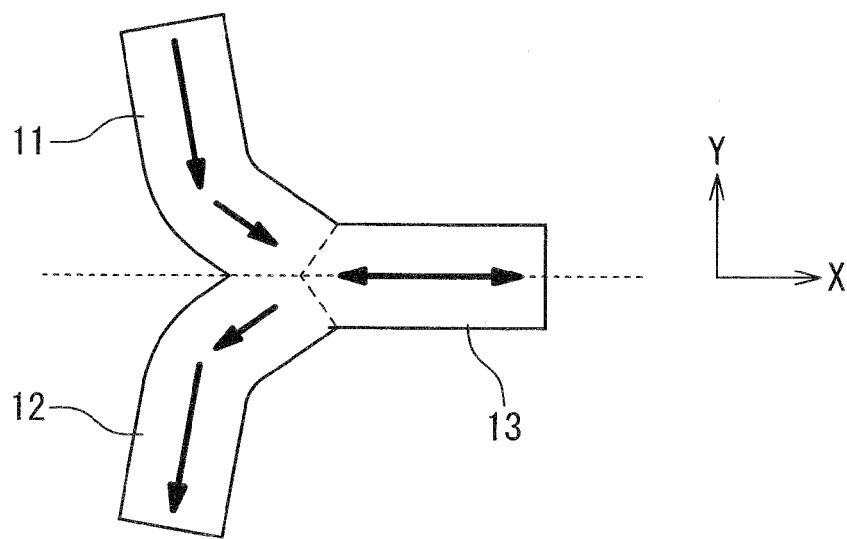
FIG. 16 is a plan view showing still another structural example of the magnetic memory cell according to the present invention.

FIG. 16 shows another shape of the magnetic recording layer 10. In FIG. 16, the first magnetization fixed region 11 and the second magnetization fixed region 12 are formed to be curved. More specifically, the extending direction of the first magnetization fixed region 11 changes from the Y direction to the X direction towards the magnetization switching region 13. Similarly, the extending direction of the second magnetization fixed region 12 changes from the Y direction to the X direction towards the magnetization switching region 13.

According to such a shape, the X component of magnetic moment of the spin electrons flowing from the magnetization fixed regions 11 and 12 into the magnetization switching region 13 is increased. Therefore, the write currents IW1 and IW2 can be reduced.

Figure 17:
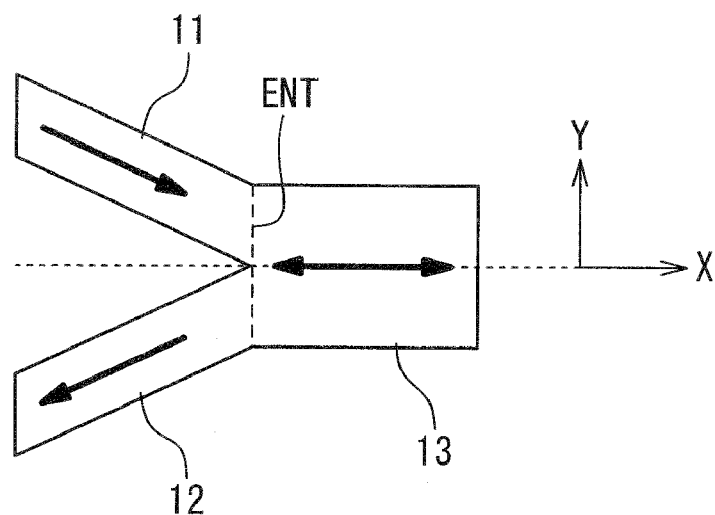
FIG. 17 is a plan view showing still another structural example of the magnetic memory cell according to the present invention.

FIG. 17 shows still another shape of the magnetic recording layer 10. In FIG. 17, the magnetization switching region 13 is formed to be wider than the other regions and its width $w_3$ is designed to be approximately equal to a sum of the width $w_1$ and the width $w_2$. The magnetization fixed regions 11 and 12 are connected to the boundary ENT of the magnetization switching region 13, and the boundary ENT is formed in a linear fashion. This shape also is included in the "Y-shape".

Figure 18:
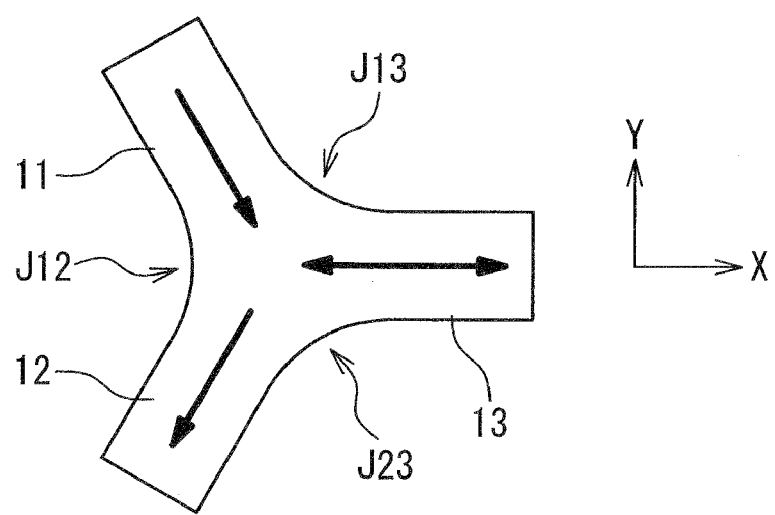
FIG. 18 is a plan view showing still another structural example of the magnetic memory cell according to the present invention.

FIG. 18 shows still another shape of the magnetic recording layer 10. In FIG. 18, respective regions of the magnetic recording layer 10 are smoothly connected with each other, and side surfaces of the magnetic recording layer 10 are rounded. More specifically, the magnetic recording layer 10 has a first side surface J13 covering the magnetization switching region 13 and the first magnetization fixed region 11, a second side surface J23 covering the magnetization switching region 13 and the second magnetization fixed region 12, and a third side surface J12 covering the first magnetization fixed region 11 and the second magnetization fixed region 12. In FIG. 18, these side surfaces J13, J23 and J12 are formed to be smooth. As a result, the supply of the spin electrons is performed smoothly and thus the write currents IW1 and IW2 can be reduced. Moreover, the direction of the fixed magnetization changes smoothly between the magnetization fixed regions 11 and 12, and thus the state of the fixed magnetization becomes stable. It should be noted that the effect is expected when at least one of the first side surface J13, the second side surface J23 and the third side surface J12 is formed to be smooth.

3. Third Exemplary Embodiment

Figure 19:
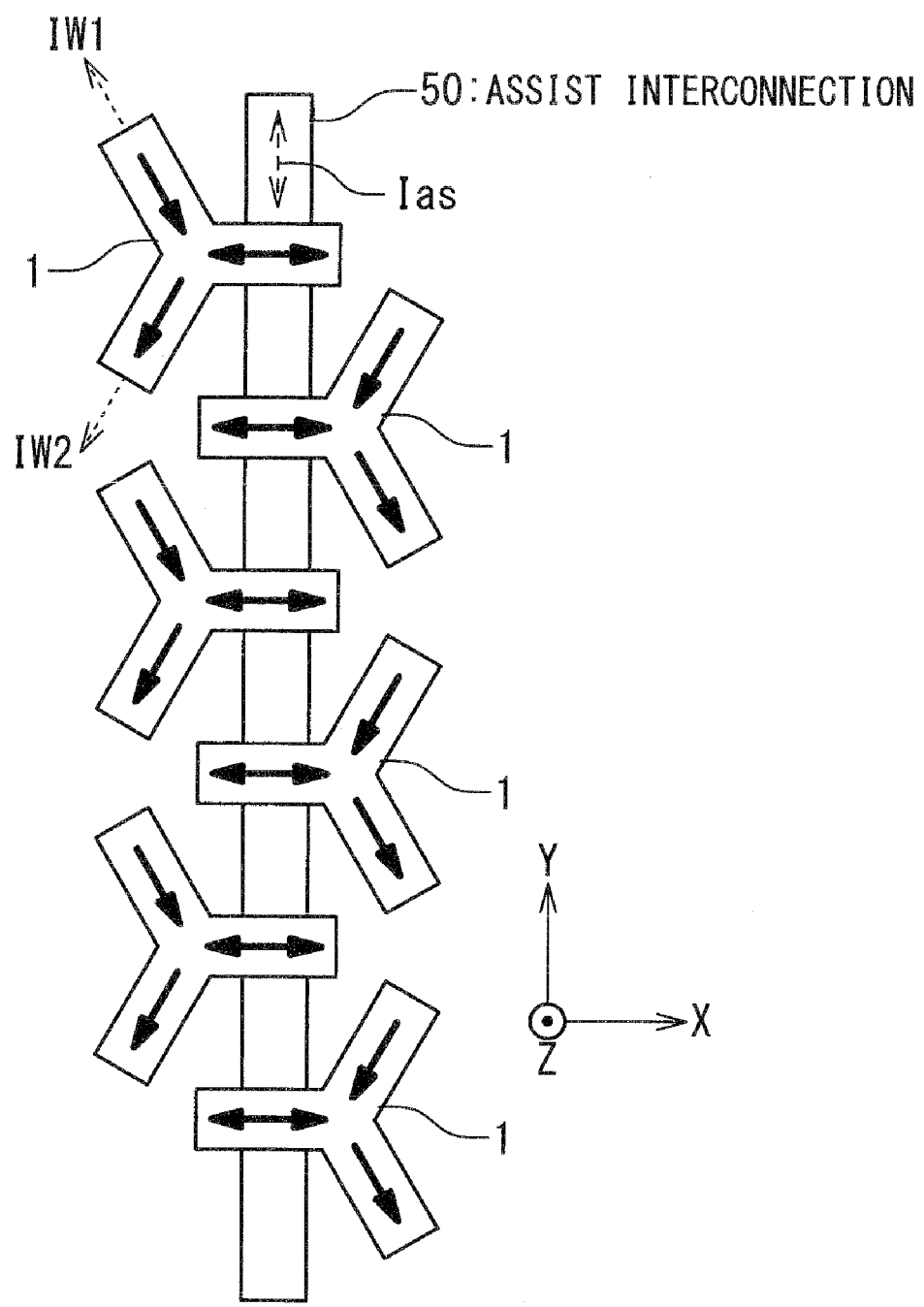
FIG. 19 is a plan view showing a structure of an MRAM according to a third exemplary embodiment of the present invention.

In order to further reduce the write currents IW1 and IW2, the magnetization switching in the magnetization switching region 13 may be assisted by a magnetic field externally applied. For example, FIG. 19 one example of a configuration in which an assist interconnection 50 for assisting the magnetization switching is provided. The assist interconnection 50 is so provided as to intersect with the magnetization switching region 13 of the magnetic memory cell 1. In FIG. 19, a plurality of magnetic memory cells 1 are arranged along the Y axis, and one assist interconnection 50 is provided in common for respective magnetization switching regions 13 of the plurality of magnetic memory cells 1.

At the time of the write operation, an assist current Ias is flowed through the assist interconnection 50 concurrently with the write currents IW1 and IW2 being flowed. A direction of a magnetic field (assist magnetic field) applied to the magnetization switching region 13 by the assist current Ias is the direction assisting the magnetization switching. For example, when the magnetization direction of the magnetization switching region 13 is changed to the +X direction in a write operation, the direction of the assist magnetic field also is set to the +X direction. In other words, a direction of the assist current Ias is controlled such that the magnetization switching is assisted. By providing the assist interconnection 50, it is possible to reduce the write currents IW1 and IW2.

Figure 20:
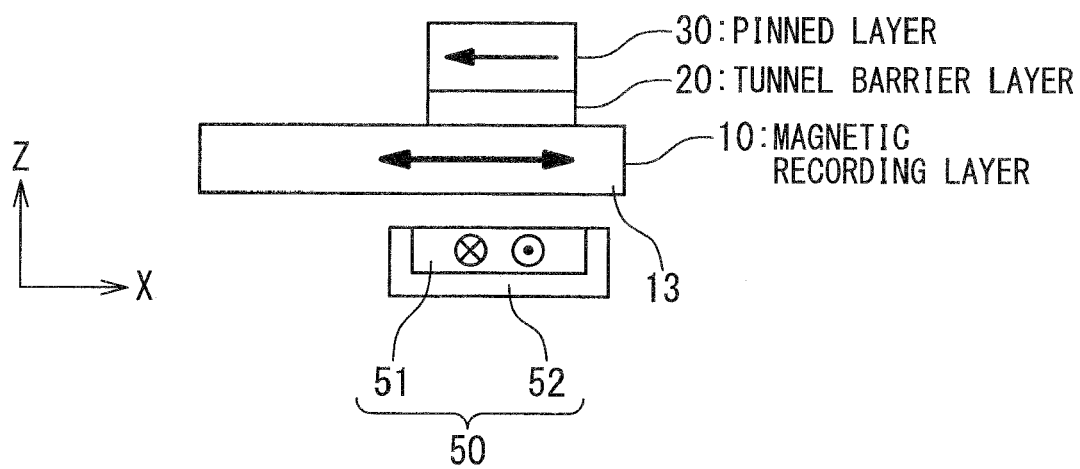
FIG. 20 is a side view showing an example of the structure according to the third exemplary embodiment.

FIG. 20 is a side view of the structure shown in FIG. 19. In FIG. 20, the assist interconnection 50 is so formed below the magnetization switching region 13 as to intersect with the magnetization switching region 13. Alternatively, the assist interconnection 50 may be provided above the magnetization switching region 13. Moreover, the assist interconnection 50 can have a yoke wire structure as shown in FIG. 20. In this case, the assist interconnection 50 is constituted by a metal interconnection 51 and a magnetic layer 52, and surfaces of the metal interconnection 51 which do not face the magnetization switching region 13 are covered by the magnetic layer 52. The magnetic layer 52 may cover only the bottom surface of the metal interconnection 51. The assist magnetic field is increased by the yoke wire structure, which enables the write currents IW1 and IW2 to be further reduced.

Figure 21:
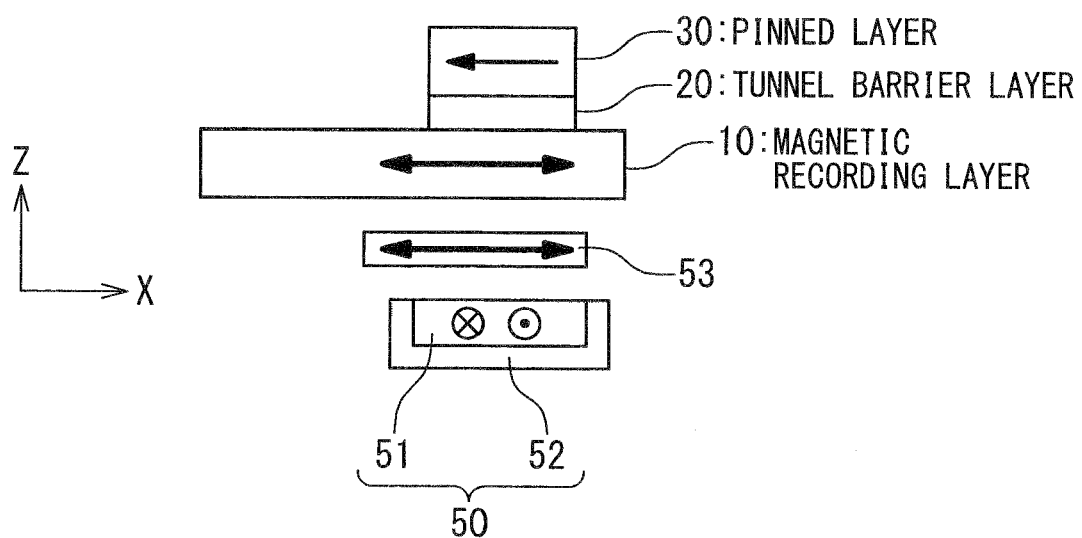
FIG. 21 is a side view showing another example of the structure according to the third exemplary embodiment.

In FIG. 21, an assist magnetic layer 53 is further provided between the magnetization switching region 13 and the assist interconnection 50. In this case, when the assist current Ias flows through the assist interconnection 50, the generated magnetic filed magnetizes the assist magnetic layer 53. The magnetization of the assist magnetic layer 53 assists the magnetization switching by a magnetic interaction (i.e. exchange coupling or static coupling). The assist magnetic layer 53 plays a role of amplifying the assist magnetic field.

The assist interconnection 50 may be separately provided for each magnetic memory cell 1. In order to reduce the number of the assist interconnections 50, one assist interconnection 50 is preferably provided in common for the plurality of magnetic memory cells 1 as shown in FIG. 19. In this case, however, the assist magnetic field is applied also to non-selected cells. Therefore, the magnetic property of the magnetization switching region 13 is designed such that the magnetization switching occurs by a combination of the spin transfer and the assist magnetic field.

4. Fourth Exemplary Embodiment

The magnetic recording layer 10 may comprise a plurality of ferromagnetic layers that are magnetically coupled with each other. In other words, the magnetic recording layer 10 may have a laminated structure (multi-layer structure). The magnetic coupling includes ferromagnetic coupling, antiferromagnetic coupling, static coupling, RKKY coupling and so forth. As an example, a case where the magnetic recording layer 10 comprises SAF (Synthetic Antiferromagnetic) layers will be described below.

Figure 22:
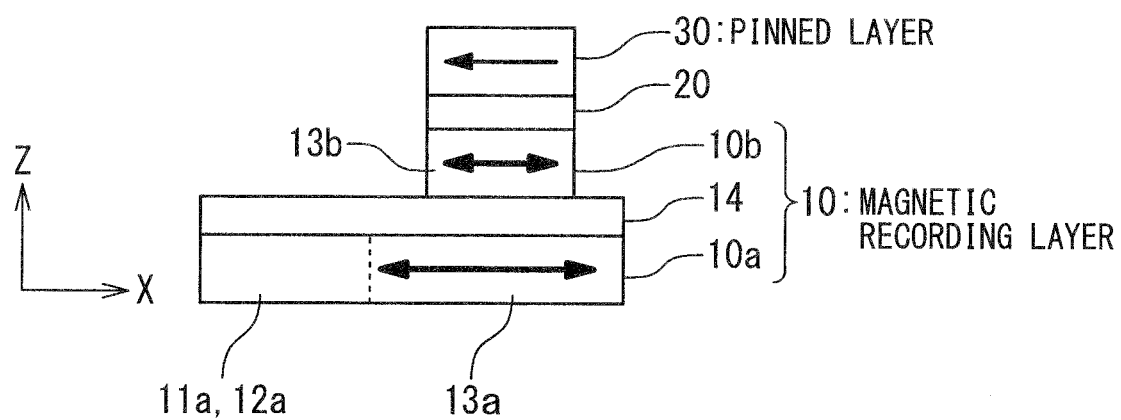
FIG. 22 is a side view showing a structure of a magnetic memory cell according to a fourth exemplary embodiment of the present invention.

In FIG. 22, the magnetic recording layer 10 includes a first ferromagnetic layer 10a and a second ferromagnetic layer 10b that are antiferromagnetically coupled with each other through an intermediate layer 14. The intermediate layer 14 is a nonmagnetic layer and, for example, a Ru layer. The first ferromagnetic layer 10a has the first magnetization fixed region 11a, the second magnetization fixed region 12a and the magnetization switching region 13a. On the other hand, the second ferromagnetic layer 10b has only the magnetization switching region 13b. The magnetization switching region 13b is adjacent to the pinned layer 30 through the tunnel barrier layer 20. The magnetization switching regions 13a and 13b are antiferromagnetically coupled with each other, and their magnetization directions are opposite to each other. Therefore, if the magnetization of one of the magnetization switching regions 13a and 13b is reversed, the other's magnetization also is reversed.

At the time of data writing, the write current flows in the first ferromagnetic layer 10a. As in the foregoing exemplary embodiments, the magnetization of the magnetization switching region 13a is reversed due to the spin transfer. In accordance with that, the magnetization of the magnetization switching region 13b of the second ferromagnetic layer 10b also is reversed. The data reading is performed by using the pinned layer 30 to sense the magnetization direction of the magnetization switching region 13b.

The same effects as in the foregoing exemplary embodiments can be obtained even by such a structure. Moreover, an effective volume of the magnetic recording layer 10 is increased due to the laminated structure, which improves the thermal disturbance resistance. Furthermore, flexibility of device design is increased for the following reason. When the magnetic recording layer 10 comprises the first ferromagnetic layer 10a, the second ferromagnetic layer 10b and the intermediate layer 14, a write characteristic is mainly controlled by the first ferromagnetic layer 10a, while a read characteristic (e.g. MR ratio) is mainly controlled by the second ferromagnetic layer 10b. Therefore, it is possible to use such materials (e.g. CoFe, CoFeB and the like) as to increase the read characteristic for the second ferromagnetic layer 10b adjacent to the tunnel barrier layer 20, and to use such materials (e.g. NiFe and the like) as to increase the write characteristic for the first ferromagnetic layer 10a in which the write current flows. That is to say, it is possible to separately and freely control the characteristics of the respective ferromagnetic layers in accordance with the desired characteristics. It is possible to improve the write characteristic and the read characteristic separately. In this manner, the flexibility of device design is improved by making the magnetic recording layer 10 multi-layer. This advantage cannot be achieved by the CPP spin transfer method. The reason is that the write characteristic and read characteristic both are controlled by a ferromagnetic layer adjacent to the tunnel barrier layer in the case of the CPP spin transfer method.

Note that the intermediate layer 14 is so formed as to have the same planar shape as the first ferromagnetic layer 10a in FIG. 22. In this case, the intermediate layer 14 plays a role of protecting the first ferromagnetic layer 10a from oxidization and etching during manufacturing processes.

Figure 23:
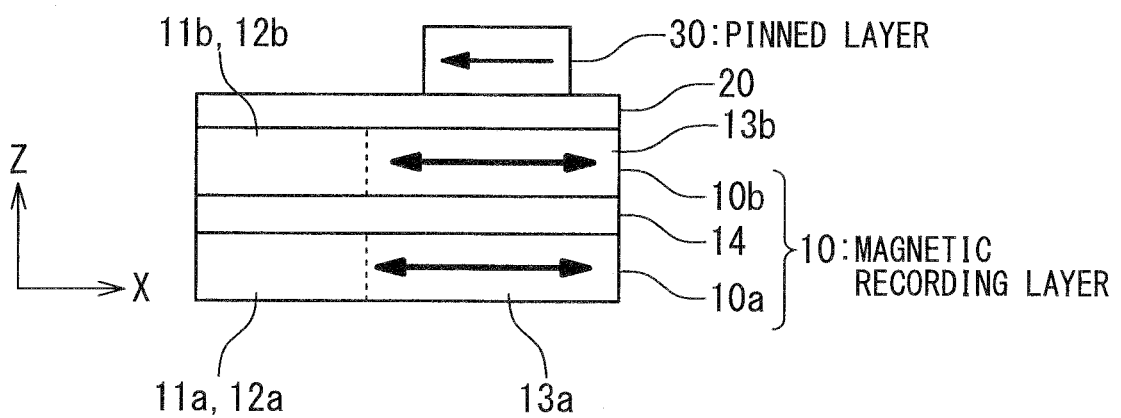
FIG. 23 is a side view showing another structural example of the magnetic memory cell according to the fourth exemplary embodiment.

FIG. 23 shows a modification example. In FIG. 23, the first ferromagnetic layer 10a has the first magnetization fixed region 11a, the second magnetization fixed region 12a and the magnetization switching region 13a. Also, the second ferromagnetic layer 10b has the first magnetization fixed region 11b, the second magnetization fixed region 12b and the magnetization switching region 13b. Directions of the fixed magnetizations of the first magnetization fixed regions 11a and 11b are opposite to each other. Directions of the fixed magnetizations of the second magnetization fixed regions 12a and 12b are opposite to each other. Also, the magnetization directions of the magnetization switching regions 13a and 13b are opposite to each other. Therefore, if the magnetization of one of the magnetization switching regions 13a and 13b is reversed, the other's magnetization also is reversed.

The data writing/reading are performed as in the case of FIG. 22. The effects to be obtained also are the same as in the case of FIG. 22. Note that the tunnel barrier layer 20 is so formed as to have the same planar shape as the magnetic recording layer 10 in FIG. 23. In this case, the tunnel barrier layer 20 plays a role of protecting the magnetic recording layer 10 from oxidization and etching during manufacturing processes.

5. Fifth Exemplary Embodiment

Figure 24:
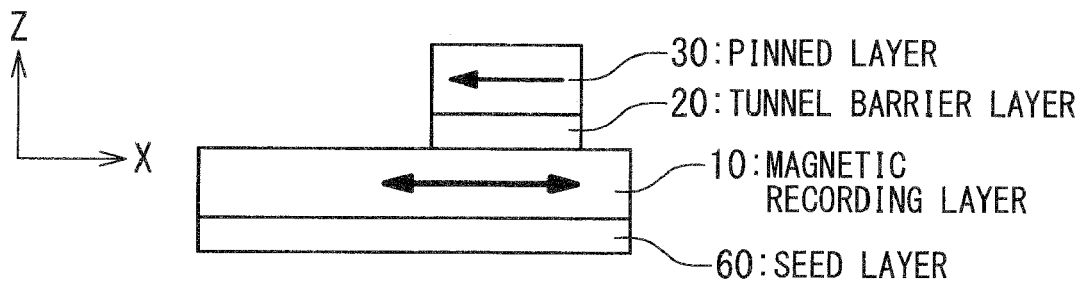
FIG. 24 is a side view showing a structure of a magnetic memory cell according to a fifth exemplary embodiment of the present invention.

FIG. 24 is a side view showing a structure of the magnetic memory cell 1 according to a fifth exemplary embodiment of the present invention. In FIG. 24, the magnetic recording layer 10 is formed on a seed layer 60. The seed layer 60 is for controlling crystal growth at the time of forming the magnetic recording layer 10. By using the seed layer 60, it is possible to control crystal characteristics of the magnetic recording layer 10 such that the write characteristic and read characteristic are improved. Note that material with high electric resistance is used for the seed layer 60 such that the write current does not selectively flow only in the seed layer 60.

6. Sixth Exemplary Embodiment

Figure 25A:
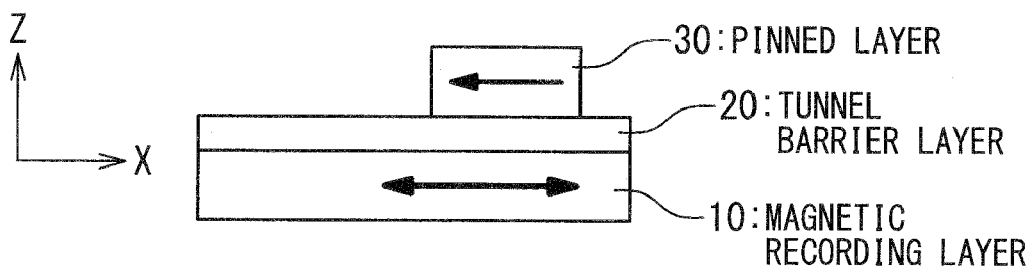
FIG. 25A is a side view showing a structure of a magnetic memory cell according to a sixth exemplary embodiment of the present invention.
Figure 25B:
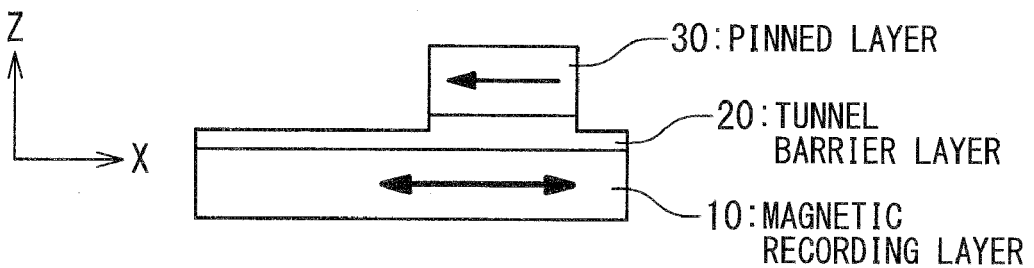
FIG. 25B is a side view showing another structural example of the magnetic memory cell according to the sixth exemplary embodiment.

FIGS. 25A and 25B are side views showing structures of the magnetic memory cell 1 according to a sixth exemplary embodiment of the present invention. In the present exemplary embodiment, the tunnel barrier layer 20 has the same planar shape as the magnetic recording layer 10. In FIG. 25A, the tunnel barrier layer 20 is uniform in thickness. Alternatively, as shown in FIG. 25B, a part of the tunnel barrier layer 20 may be removed by etching at the time of forming the pinned layer 30. In either case, the tunnel barrier layer 20 plays a role of protecting the magnetic recording layer 10 from oxidization and etching during manufacturing processes.

The invention claimed is:

1. An MRAM comprising:
   a magnetic recording layer being a ferromagnetic layer; and
   a pinned layer connected to said magnetic recording layer through a nonmagnetic layer,
   wherein said magnetic recording layer includes:
   a magnetization switching region having reversible magnetization and overlapping with said pinned layer;
   a first magnetization fixed region having first fixed magnetization and connected to one end of said magnetization switching region; and
   a second magnetization fixed region having second fixed magnetization and connected to said one end,
   wherein one of said first fixed magnetization and said second fixed magnetization is fixed in a direction toward said one end, and the other is fixed in a direction away from said one end.

2. The MRAM according to claim 1,
   wherein said magnetization switching region, said first magnetization fixed region and said second magnetization fixed region form a three-way intersection.

3. The MRAM according to claim 1,
   wherein said magnetic recording layer is formed in a Y-shape,
   wherein a longitudinal direction of said magnetization switching region is a first direction, a longitudinal direction of said first magnetization fixed region is a second direction, and a longitudinal direction of said second magnetization fixed region is a third direction.

4. The MRAM according to claim 3,
   wherein an angle between said first direction and said second direction is equal to an angle between said first direction and said third direction.

5. The MRAM according to claim 3,
   wherein said magnetic recording layer is mirror symmetric with respect to an axis along said first direction.

6. The MRAM according to claim 3,
   wherein said magnetic recording layer has:
   a first side surface covering said magnetization switching region and said first magnetization fixed region;
   a second side surface covering said magnetization switching region and said second magnetization fixed region; and
   a third side surface covering said first magnetization fixed region and said second magnetization fixed region,
   wherein at least one of said first side surface, said second side surface and said third side surface is formed to be smooth.

7. The MRAM according to claim 1,
wherein said magnetization switching region, said first magnetization fixed region and said second magnetization fixed region are formed in a same plane.

8. The MRAM according to claim 1, further comprising a pinning layer configured to fix directions of said first fixed magnetization and said second fixed magnetization by any of exchange coupling and static coupling.

9. The MRAM according to claim 8,
wherein said pinning layer is so provided as to overlap with at least said first magnetization fixed region and said second magnetization fixed region,
wherein a magnetization direction of said pinning layer is a direction from said first magnetization fixed region toward said second magnetization fixed region or a direction from said second magnetization fixed region toward said first magnetization fixed region.

10. The MRAM according to claim 8,
wherein said pinning layer includes:
a first pinning layer configured to fix a direction of said first fixed magnetization; and
a second pinning layer configured to fix a direction of said second fixed magnetization.

11. The MRAM according to claim 1,
wherein said first magnetization fixed region and said second magnetization fixed region are so formed as to have magnetocrystalline anisotropy along a direction in which said first magnetization fixed region and said second magnetization fixed region are arranged.

12. The MRAM according to claim 1,
wherein an external magnetic field is applied in a direction from said first magnetization fixed region toward said second magnetization fixed region or in a direction from said second magnetization fixed region toward said first magnetization fixed region.

13. The MRAM according to claim 1,
wherein said magnetic recording layer comprises a plurality of ferromagnetic layers that are magnetically coupled with each other,
wherein at least one of said plurality of ferromagnetic layers includes said magnetization switching region, said first magnetization fixed region and said second magnetization fixed region.

14. The MRAM according to claim 1, comprising a plurality of magnetic memory cells arranged in an array,
wherein each of said plurality of magnetic memory cells comprises said magnetic recording layer and said pinned layer.

15. The MRAM according to claim 14,
wherein said plurality of magnetic memory cells includes a first magnetic memory cell and a second magnetic memory cell that are arranged along a first axis,
wherein a shape of said magnetic recording layer of said first magnetic memory cell and a shape of said magnetic recording layer of said second magnetic memory cell are line-symmetric with respect to said first axis.

16. The MRAM according to claim 1,
wherein in a first write operation, a first write current is flowed from said magnetization switching region to said first magnetization fixed region through said one end,
wherein in a second write operation, a second write current is flowed from said magnetization switching region to said second magnetization fixed region through said one end.

17. The MRAM according to claim 16,
wherein said first fixed magnetization is fixed in a direction toward said one end, and said second fixed magnetization is fixed in a direction away from said one end,
wherein magnetization of said magnetization switching region is directed to a direction away from said one end by said first write operation, and magnetization of said magnetization switching region is directed to a direction toward said one end by said second write operation.

18. The MRAM according to claim 16,
wherein said first fixed magnetization is fixed in a direction away from said one end, and said second fixed magnetization is fixed in a direction toward said one end,
wherein magnetization of said magnetization switching region is directed to a direction toward said one end by said first write operation, and magnetization of said magnetization switching region is directed to a direction away from said one end by said second write operation.

19. The MRAM according to claim 17, further comprising an assist interconnection formed to intersect with said magnetization switching region,
wherein in said first write operation, a direction of a magnetic field applied to said magnetization switching region by a current flowing through said assist interconnection is away from said one end,
wherein in said second write operation, a direction of a magnetic field applied to said magnetization switching region by a current flowing through said assist interconnection is toward said one end.

20. The MRAM according to claim 18, further comprising an assist interconnection formed to intersect with said magnetization switching region,
wherein in said first write operation, a direction of a magnetic field applied to said magnetization switching region by a current flowing through said assist interconnection is toward said one end,
wherein in said second write operation, a direction of a magnetic field applied to said magnetization switching region by a current flowing through said assist interconnection is away from said one end.

21. The MRAM according to claim 19, comprising a plurality of magnetic memory cells,
wherein each of said plurality of magnetic memory cells comprises said magnetic recording layer and said pinned layer,
wherein said assist interconnection is provided in common for respective magnetization switching regions of said plurality of magnetic memory cells.

22. The MRAM according to claim 16,
wherein in a read operation, a read current is flowed between said pinned layer and said magnetic recording layer through said nonmagnetic layer.

23. A data read and write method for an MRAM,
said MRAM comprising:
a magnetic recording layer being a ferromagnetic layer; and
a pinned layer connected to said magnetic recording layer through a nonmagnetic layer,
wherein said magnetic recording layer includes:
a magnetization switching region having reversible magnetization and overlapping with said pinned layer;
a first magnetization fixed region having first fixed magnetization; and
a second magnetization fixed region having second fixed magnetization, wherein said magnetization switching region, said first magnetization fixed region and said second magnetization fixed region form a three-way intersection, wherein one of said first fixed magnetization and said second fixed magnetization is fixed in a direction toward said magnetization switching region, and the other is fixed in a direction away from said magnetization switching region, said data read and write method comprising:

flowing a first write current from said magnetization switching region to said first magnetization fixed region, when writing a first data; and flowing a second write current from said magnetization switching region to said second magnetization fixed region, when writing a second data.

24. The data read and write method for the MRAM according to claim 23, further comprising: flowing a read current between said pinned layer and said magnetic recording layer through said nonmagnetic layer, when reading said first data or said second data.

* * * * *